(12) United States Patent
Li

(10) Patent No.: US 12,736,566 B2
(45) Date of Patent: Sep. 15, 2026

(54) METHOD FOR DETECTING IMPEDANCE OF CHARGING CABLE, ELECTRONIC DEVICE, AND POWER SUPPLY DEVICE

(71) Applicant: Honor Device Co., Ltd., Shenzhen (CN)

(72) Inventor: Zhifang Li, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 785 days.

(21) Appl. No.: 18/016,924

(22) PCT Filed: Aug. 22, 2022

(86) PCT No.: PCT/CN2022/114004
§ 371 (c)(1),
(2) Date: Jan. 19, 2023

(87) PCT Pub. No.: WO2023/077919
PCT Pub. Date: May 11, 2023

(65) Prior Publication Data
US 2024/0248125 A1 Jul. 25, 2024

(30) Foreign Application Priority Data
Nov. 4, 2021 (CN) ......................... 202111300983.7

(51) Int. Cl.
*G01R 27/16* (2006.01)
*G01R 27/08* (2006.01)
(Continued)

(52) U.S. Cl.
CPC ............. *G01R 27/16* (2013.01); *G01R 27/08* (2013.01); *G01R 31/58* (2020.01); *H02J 7/42* (2026.01);
(Continued)

(58) Field of Classification Search
CPC ...................................................... G01R 27/16
See application file for complete search history.

(56) References Cited

U.S. PATENT DOCUMENTS 10,601,242 B2 3/2020 Lu et al.
2017/0038810 A1* 2/2017 Ueki ....................... G06F 1/266
(Continued)

FOREIGN PATENT DOCUMENTS

CN 106410882 A 2/2017
CN 106546822 A * 3/2017 ............. G01R 27/08
(Continued)

OTHER PUBLICATIONS

CN106546822 tanslation, Charging Method of The Charger and USB Charging System, Yi (Year: 2017).*

*Primary Examiner* — Tynese V McDaniel
(74) *Attorney, Agent, or Firm* — Slater Matsil, LLP

(57) ABSTRACT
This application relates to the field of charging management, and provides a method for detecting impedance of a charging cable, an electronic device, and a power supply device, to more accurately detect impedance of a charging cable. Calculating, by the electronic device, an impedance value of the charging cable according to a first source voltage detection value, a second source voltage detection value, a first final voltage detection value, a second final voltage detection value, a first current value, and a second current value.

18 Claims, 8 Drawing Sheets

(51) Int. Cl.

*G01R 31/58* (2020.01)
*H02J 7/42* (2026.01)
*H02J 7/80* (2026.01)
*H02J 7/90* (2026.01)

(52) U.S. Cl.

CPC ................ *H02J 7/80* (2026.01); *H02J 7/933* (2026.01); *H02J 2207/30* (2020.01)

(56) References Cited

U.S. PATENT DOCUMENTS

2017/0063105 A1* 3/2017 Chu ........................ H02J 7/007
2017/0085109 A1* 3/2017 Zhang ................... H01M 10/48
2017/0126023 A1* 5/2017 Jung ................... H02J 7/00308
2017/0149252 A1* 5/2017 Zhang ................... H02J 7/0045
2017/0207647 A1* 7/2017 Zhang ...................... G01K 1/14
2018/0069393 A1* 3/2018 Iwata ..................... H03K 17/08
2018/0109118 A1* 4/2018 Sun ........................... H02J 7/04
2019/0305573 A1* 10/2019 Xiao ......................... H02J 7/00
2020/0014235 A1* 1/2020 Lin ................... H02J 7/007194
2022/0123573 A1* 4/2022 Moubedi ................. H02J 7/007
2024/0022084 A1* 1/2024 Guo ......................... H04B 3/02
2025/0004060 A1* 1/2025 Li ........................ G01R 31/392

FOREIGN PATENT DOCUMENTS

CN 206248724 U 6/2017
CN 107196372 A 9/2017
CN 108318741 A 7/2018
CN 109428245 A 3/2019
CN 106546822 B 4/2019
CN 111007321 A 4/2020
CN 111316523 A 6/2020
CN 106415983 B 9/2020
CN 114221400 A 3/2022
WO 2016155320 A1 10/2016
WO 2019075687 A1 4/2019

* cited by examiner

METHOD FOR DETECTING IMPEDANCE OF CHARGING CABLE, ELECTRONIC DEVICE, AND POWER SUPPLY DEVICE

CROSS-REFERENCE TO RELATED APPLICATIONS

This application is a national stage of International Application No. PCT/CN2022/114004, filed on Aug. 22, 2022, which claims priority to Chinese Patent Application No. 202111300983.7, filed on Nov. 4, 2021. The disclosures of both of the aforementioned applications are hereby incorporated by reference in their entireties.

TECHNICAL FIELD

This application relates to the field of charging technologies, and in particular, to a method for detecting impedance of a charging cable, an electronic device, and a power supply device.

BACKGROUND

At present, to better ensure usage for users, an increasing quantity of electronic devices (for example, mobile phones or smart wearable devices) have a quick charging (QC for short below) function. During charging, the voltage and current of quick charging are both greater than those of ordinary charging. Therefore, quick charging usually requires very small impedance on the charging cable. In this way, during quick charging, the electronic device generates a very small amount of heat as being charged, so that a charging loss is smaller, and further, the charging efficiency and safety are higher.

Based on this, the existing electronic devices proactively detect impedance of the charging cables when being charged. Only when the impedance of the charging cable is less than a preset threshold (for example, 300 milliohms (mΩ)), the electronic device negotiates with the power supply device (for example, a switch power adapter) for quick charging; otherwise, ordinary charging is performed. In the existing detection solutions, a constant current is inputted to the charging cable, then voltage values at both ends of the charging cable are measured, and finally, impedance of the charging cable is calculated according to the measured voltages and the constant current. However, because the accuracy of the voltage detection precision cannot be guaranteed, there may be an error in final detected impedance of the charging cable, which prevents the electronic device from negotiating the most appropriate charging mode with the power supply device, and further affects the charging safety or charging efficiency of the electronic device.

SUMMARY

Embodiments of this application provide a method for detecting impedance of a charging cable, an electronic device, and a power supply device, to more accurately detect impedance of a charging cable.

To achieve the foregoing objective, the technical solutions are adopted in the embodiments of this application:

According to a first aspect, this application provides a method for detecting impedance of a charging cable. The method can be applied to an electronic device in a charging system. The charging system includes a power supply device, the charging cable, and the electronic device. A first end of the charging cable is connected to the power supply device, and a second end of the charging cable is connected to the electronic device. The method includes: first, receiving, by the electronic device, first electric energy from the power supply device through the charging cable, and obtaining a first source voltage detection value of the first end of the charging cable and a first final voltage detection value of the second end of the charging cable, where a voltage of the first electric energy is constant, and a current of the first electric energy is a first current value; then, receiving, by the electronic device, second electric energy from the power supply device through the charging cable, and obtaining a second source voltage detection value of the first end of the charging cable and a second final voltage detection value of the second end of the charging cable, where a voltage of the second electric energy is the same as the voltage of the first electric energy, and a current of the second electric energy is a second current value; and finally, calculating, by the electronic device, an impedance value of the charging cable according to the first source voltage detection value, the second source voltage detection value, the first final voltage detection value, the second final voltage detection value, the first current value, and the second current value.

Based on the foregoing technical solution, the electronic device can measure voltage values of both ends of the charging cable when the power supply device supplies power to the electronic device with two different types of constant voltage and constant current electric energy (for example, 10 V x A electric energy and 10 V y A electric energy) through the charging cable respectively. Because the impedance of the charging cable itself is very small (milliohm level), and the same detection method is used for voltage detection, the error of voltage detection is slightly affected by the current, and all the measurements have the same error rate. Based on this, it can be learned that two measurements of voltages of an end of the charging cable connected to the power supply device have the same error, if currents corresponding to the two measurements are controlled from affecting voltages of an end of the charging cable connected to the electronic device too much, two measurements of the voltages of the end of the charging cable connected to the electronic device have the same error or errors that have only a slight difference. In this way, it can be considered that voltage differences between two ends of the charging cable obtained through two measurements have the same error value. That is, voltages that are carried by the charging cable and that are obtained through two measurements and calculations have the same error. Therefore, based on this, two sets of voltage values (the first source voltage detection value and the first final voltage detection value, as well as the second source voltage detection value and the second final voltage detection value) obtained through the foregoing two measurements and current values (the first current value and the second current value) in the two measurements can be used, to calculate the impedance of the charging cable more accurately.

Further, the more accurate impedance of the charging cable can also provide effective data support for a mobile phone to negotiate with the switch power adapter to select a correct charging mode, thereby ensuring that the mobile phone and the switch power adapter can negotiate the most appropriate charging mode, and improving the charging safety and charging efficiency of the mobile phone.

In a possible design manner of the first aspect, the method further includes: instructing, by the electronic device when the impedance value of the charging cable is less than a preset threshold, the power supply device to perform quick charging for the electronic device. The quick charging refers to a charging mode in which the electronic device is charged from zero power to full power within a preset duration.

For example, the preset threshold may be 300 mΩ.

Because the voltage and current during quick charging are both relatively high, to ensure the safety of the charging, quick charging usually requires very small impedance on the charging cable. Based on the foregoing solution, after the more accurate impedance value of the charging cable is obtained, when the impedance value of the charging cable meets the requirements of quick charging, the electronic device and the power supply device can accurately negotiate charging the electronic device in quick charging mode, which not only ensures the charging safety, but also ensures the charging efficiency.

In another possible design manner of the first aspect, the method further includes: instructing, by the electronic device when the impedance value of the charging cable is greater than the preset threshold, the power supply device to perform ordinary charging for the electronic device. The ordinary charging refers to a charging mode in which the electronic device is charged from zero power to full power within a duration longer than a preset duration.

Based on the foregoing solution, after the more accurate impedance value of the charging cable is obtained, when the impedance value of the charging cable does not meet the requirements of quick charging, the electronic device and the power supply device can accurately negotiate charging the electronic device in ordinary charging mode, which ensures the charging safety.

In a possible design manner of the first aspect, before the receiving, by the electronic device, first electric energy from the power supply device through the charging cable, the method further includes: sending a first request to the power supply device through the charging cable in a case that the electronic device detects that the power supply device supplies power to the electronic device through the charging cable. The first request is used for requesting the power supply device to provide the first electric energy to the electronic device through the charging cable and requesting the power supply device to indicate the first source voltage detection value of the first end of the charging cable to the electronic device.

The obtaining a first source voltage detection value of the first end of the charging cable and a first final voltage detection value of the second end of the charging cable includes: receiving, by the electronic device, the first source voltage detection value indicated by the power supply device; and detecting, by the electronic device, the first final voltage detection value of the second end of the charging cable. An order in which the electronic device receives the first source voltage detection value and the electronic device detects the first final voltage detection value is not an absolute order, and may depend on an actual situation.

Based on the foregoing solution, the electronic device may send a first request to the power supply device through the charging cable when detecting that the power supply device starts to supply power to the electronic device, so that the power supply device can detect a first source voltage detection value and indicates the first source voltage detection value to the electronic device after providing first electric energy to the electronic device. In addition, the electronic device can detect a first final voltage detection value at the same time. In this way, the first request is sent by the electronic device to the power supply device through the charging cable, the first source voltage detection value is indicated by the power supply device to the electronic device through the charging cable, and the speed of wired communication is very high. Therefore, the electronic device can quickly obtain the first source voltage detection value and the first final voltage detection value, to data support for subsequent calculation of the impedance of the charging cable.

In a possible design manner of the first aspect, before the receiving, by the electronic device, second electric energy from the power supply device through the charging cable, the method further includes: sending, by the electronic device, a second request to the power supply device through the charging cable after obtaining the first source voltage detection value and the first final voltage detection value. The second request is used for requesting the power supply device to provide the second electric energy to the electronic device through the charging cable and requesting the power supply device to indicate the second source voltage detection value of the first end of the charging cable to the electronic device.

The obtaining a second source voltage detection value of the first end of the charging cable and a second final voltage detection value of the second end of the charging cable includes: receiving, by the electronic device, the second source voltage detection value indicated by the power supply device; and detecting, by the electronic device, the second final voltage detection value of the second end of the charging cable. An order in which the electronic device receives the second source voltage detection value and the electronic device detects the second final voltage detection value is not an absolute order, and can be determined according to an actual situation.

Based on the foregoing solution, the electronic device may send a second request to the power supply device through the charging cable after obtaining the first source voltage detection value and the first final voltage detection value, so that the power supply device can detect a second source voltage detection value and indicates the second source voltage detection value to the electronic device after providing second electric energy to the electronic device. In addition, the electronic device can detect a second final voltage detection value at the same time. In this way, the second request is sent by the electronic device to the power supply device through the charging cable, the first source voltage detection value is indicated by the power supply device to the electronic device through the charging cable, and the speed of wired communication is very high. Therefore, the electronic device can quickly obtain the second source voltage detection value and the second final voltage detection value, to data support for subsequent calculation of the impedance of the charging cable.

The technical solutions provided in this application are carried out based on the principle that when the first electric energy and the second electric energy pass through the charging cable, errors of voltage detection at both ends of the charging cable are the same. Moreover, the impedance of the charging cable itself is very small (milliohm level), and the same detection method is used for voltage detection. In addition, the voltages (voltages inputted to an end of the charging cable connected to the power supply device) of the first electric energy and the second electric energy are the same. Therefore, to prevent errors of voltage detection in two measurements from being affected by different current values in the two measurements, the first current value cannot be greatly different from the second current value. Therefore, in a possible design manner of the first aspect, an absolute value of a difference between the first current value and the second current value is less than two times the first current value, and the absolute value of the difference between the first current value and the second current value is less than two times the second current value.

In this way, because initial voltages (that is, actual voltages received by an end of the charging cable connected to the power supply device) of the first electric energy and the second electric energy inputted to the charging cable are the same, and the same method is used for voltage detection, errors of two measurements of voltages of the end of the charging cable connected to the power supply device are the same. In addition, because the difference between the first current value and the second current value is small, two measurements of the voltages of the end of the charging cable connected to the electronic device have the same error or errors that have only a slight difference. Therefore, it can be considered that voltage differences between two ends of the charging cable obtained through two measurements have the same error value. That is, voltages that are carried by the charging cable and that are obtained through two measurements and calculations have the same error. In this way, the impedance value of the charging cable calculated in the technical solutions provided by this application is more accurate.

In a possible design manner of the first aspect, the calculating, by the electronic device, an impedance value of the charging cable according to the first source voltage detection value, the second source voltage detection value, the first final voltage detection value, the second final voltage detection value, the first current value, and the second current value includes: calculating, by the electronic device, the impedance value of the charging cable according to the first source voltage detection value, the second source voltage detection value, the first final voltage detection value, the second final voltage detection value, the first current value, and the second current value by using the following formula:

$$Rcable = [(\text{Vadp\_detection\_yA} - \text{Vadp\_detection\_xA}) - (\text{Vbus\_detection\_yA} - \text{Vbus\_detection\_xA})]/(yA - xA)$$

where Rcable is the impedance value of the charging cable, Vadp_detection_yA is the second source voltage detection value, Vadp_detection_xA is the first source voltage detection value, Vbus_detection_yA is the second final voltage detection value, Vbus_detection_xA is the first final voltage detection value, yA is the second current value, and xA is the first current value.

Based on the foregoing solutions, a calculation formula of the impedance Rcable of the charging cable may be obtained by using the principle that the errors of the voltages carried by the charging cable in two measurements are the same (that is, ΔVref_xA=Vbus_detection_xA+xA*Rcable−Vadp_detection_xA=ΔVref_yA=Vbus_detection_yA+yA*Rcable−Vadp_detection_yA) (for a specific deduction process, refer to the related descriptions in the embodiments), to more accurately calculate the impedance of the charging cable.

According to a second aspect, this application provides a method for detecting impedance of a charging cable, applied to a power supply device in a charging system. The charging system includes the power supply device, the charging cable, and an electronic device. A first end of the charging cable is connected to the power supply device, and a second end of the charging cable is connected to the electronic device. The method includes: first receiving, by the power supply device, a first request from the electronic device through the charging cable, where the first request is used for requesting the power supply device to provide the first electric energy to the electronic device through the charging cable and requesting the power supply device to indicate the first source voltage detection value of the first end of the charging cable to the electronic device, and a voltage of the first electric energy is constant, and a current of the first electric energy is a first current value; then, providing, by the power supply device, the first electric energy to the electronic device through the charging cable in response to the first request, and indicating, after detecting the first source voltage detection value of the first end of the charging cable, the first source voltage detection value to the electronic device; afterward, receiving, by the power supply device, a second request from the electronic device through the charging cable, where the second request is used for requesting the power supply device to provide the second electric energy to the electronic device through the charging cable and requesting the power supply device to indicate the second source voltage detection value of the first end of the charging cable to the electronic device, and a voltage of the second electric energy is the same as the voltage of the first electric energy, and a current of the second electric energy is a second current value; and finally, providing, by the power supply device, the second electric energy to the electronic device through the charging cable in response to the second request, and indicating, after detecting the second source voltage detection value of the first end of the charging cable, the second source voltage detection value to the electronic device.

Based on the foregoing solution, the power supply device may receive a first request and a second request from the electronic device through the charging cable in real time, and timely indicate, to the electronic device, a first source voltage detection value detected when the power supply device supplies first electric energy to the electronic device and a second source voltage detection value detected when the power supply device supplies second electric energy to the electronic device. Based on this, the electronic device can quickly obtain the first source voltage detection value and the second source voltage detection value, to data support for subsequently calculating the impedance of the charging cable more accurately.

In a possible design manner of the second aspect, an absolute value of a difference between the first current value and the second current value is less than two times the first current value, and the absolute value of the difference between the first current value and the second current value is less than two times the second current value.

According to a third aspect, this application provides an electronic device. The electronic device is applied to a power supply device in a charging system. The charging system includes the power supply device, the charging cable, and an electronic device. A first end of the charging cable is connected to the power supply device, and a second end of the charging cable is connected to the electronic device. The electronic device includes: a processor, a memory, a battery, and a charging interface. The memory, the battery, and the charging interface are coupled to the processor. The memory stores computer program code, and the computer program code includes computer instructions; and in a case that the charging interface of the electronic device is connected to the charging cable, and it is detected that the power supply device supplies power to the electronic device through the charging cable, the computer instructions are executed by the processor, to cause the electronic device to perform the method for detecting impedance of a charging cable according to the first aspect.

According to a fourth aspect, this application provides an electronic device. The electronic device is applied to a power supply device in a charging system. The charging system includes the power supply device, the charging cable, and an electronic device. A first end of the charging cable is connected to the power supply device, and a second end of the charging cable is connected to the electronic device. The electronic device includes: a processor, a memory, a battery, and a charging interface. The memory, the battery, and the charging interface are coupled to the processor. The memory stores computer program code, and the computer program code includes computer instructions; and in a case that the charging interface of the electronic device is connected to the charging cable, and it is detected that the power supply device supplies power to the electronic device through the charging cable, the computer instructions are executed by the processor, to cause the electronic device to perform the following steps: receiving, by the electronic device, first electric energy from the power supply device through the charging cable, and obtaining a first source voltage detection value of the first end of the charging cable and a first final voltage detection value of the second end of the charging cable, where a voltage of the first electric energy is constant, and a current of the first electric energy is a first current value; then, receiving, by the electronic device, second electric energy from the power supply device through the charging cable, and obtaining a second source voltage detection value of the first end of the charging cable and a second final voltage detection value of the second end of the charging cable, where a voltage of the second electric energy is the same as the voltage of the first electric energy, and a current of the second electric energy is a second current value; and finally, calculating, by the electronic device, an impedance value of the charging cable according to the first source voltage detection value, the second source voltage detection value, the first final voltage detection value, the second final voltage detection value, the first current value, and the second current value.

In a possible design manner of the fourth aspect, when the computer instructions are executed by the processor, the electronic device is caused to further perform the following step: instructing, by the electronic device when the impedance value of the charging cable is less than a preset threshold, the power supply device to perform quick charging for the electronic device. The quick charging refers to a charging mode in which the electronic device is charged from zero power to full power within a preset duration.

In a possible design manner of the fourth aspect, when the computer instructions are executed by the processor, the electronic device is caused to further perform the following steps: before the receiving, by the electronic device, first electric energy from the power supply device through the charging cable, sending a first request to the power supply device through the charging cable in a case that the electronic device detects that the power supply device supplies power to the electronic device through the charging cable, where the first request is used for requesting the power supply device to provide the first electric energy to the electronic device through the charging cable and requesting the power supply device to indicate the first source voltage detection value of the first end of the charging cable to the electronic device; then, receiving, by the electronic device, the first source voltage detection value indicated by the power supply device; and detecting, by the electronic device, the first final voltage detection value of the second end of the charging cable.

In a possible design manner of the fourth aspect, when the computer instructions are executed by the processor, the electronic device is caused to further perform the following steps: before the receiving, by the electronic device, second electric energy from the power supply device through the charging cable, sending, by the electronic device, a second request to the power supply device through the charging cable after obtaining the first source voltage detection value and the first final voltage detection value, where the second request is used for requesting the power supply device to provide the second electric energy to the electronic device through the charging cable and requesting the power supply device to indicate the second source voltage detection value of the first end of the charging cable to the electronic device; then, receiving, by the electronic device, the second source voltage detection value indicated by the power supply device; and detecting, by the electronic device, the second final voltage detection value of the second end of the charging cable.

In a possible design manner of the fourth aspect, an absolute value of a difference between the first current value and the second current value is less than two times the first current value, and the absolute value of the difference between the first current value and the second current value is less than two times the second current value.

In a possible design manner of the fourth aspect, when the computer instructions are executed by the processor, the electronic device is caused to further perform the following step: calculating, by the electronic device, an impedance value of the charging cable according to the first source voltage detection value, the second source voltage detection value, the first final voltage detection value, the second final voltage detection value, the first current value, and the second current value by using the following formula $$Rcable = [(\text{Vadp\_detection\_yA} - \text{Vadp\_detection\_xA}) - (\text{Vbus\_detection\_yA} - \text{Vbus\_detection\_xA})]/(yA - xA)$$

where Rcable is the impedance value of the charging cable, Vadp_detection_yA is the second source voltage detection value, Vadp_detection_xA is the first source voltage detection value, Vbus_detection_yA is the second final voltage detection value, Vbus_detection_xA is the first final voltage detection value, yA is the second current value, and xA is the first current value.

According to a fifth aspect, this application provides a power supply device. The power supply device is applied to a power supply device in a charging system. The charging system includes the power supply device, the charging cable, and an electronic device. A first end of the charging cable is connected to the power supply device, and a second end of the charging cable is connected to the electronic device. The power supply device including a memory, a processor, a bus, and a power supply interface. The memory is configured to store computer-executable instructions, and the processor is connected to the memory by the bus. In a case that the power supply interface of the power supply device is connected to the charging cable and supplies power to the electronic device, the processor executes the computer-executable instructions stored in the memory, to cause the power supply device to perform the method for detecting impedance of a charging cable according to the second aspect.

According to a sixth aspect, this application provides a power supply device. The power supply device is applied to a power supply device in a charging system. The charging system includes the power supply device, the charging cable, and an electronic device. A first end of the charging cable is connected to the power supply device, and a second end of the charging cable is connected to the electronic device. The power supply device including a memory, a processor, a bus, and a power supply interface. The memory is configured to store computer-executable instructions, and the processor is connected to the memory by the bus. In a case that the power supply interface of the power supply device is connected to the charging cable and supplies power to the electronic device, the processor executes the computer-executable instructions stored in the memory, to cause the power supply device to perform the following step: first receiving, by the power supply device, a first request from the electronic device through the charging cable, where the first request is used for requesting the power supply device to provide the first electric energy to the electronic device through the charging cable and requesting the power supply device to indicate the first source voltage detection value of the first end of the charging cable to the electronic device, and a voltage of the first electric energy is constant, and a current of the first electric energy is a first current value; then, providing, by the power supply device, the first electric energy to the electronic device through the charging cable in response to the first request, and indicating, after detecting the first source voltage detection value of the first end of the charging cable, the first source voltage detection value to the electronic device; afterward, receiving, by the power supply device, a second request from the electronic device through the charging cable, where the second request is used for requesting the power supply device to provide the second electric energy to the electronic device through the charging cable and requesting the power supply device to indicate the second source voltage detection value of the first end of the charging cable to the electronic device, and a voltage of the second electric energy is the same as the voltage of the first electric energy, and a current of the second electric energy is a second current value; and finally, providing, by the power supply device, the second electric energy to the electronic device through the charging cable in response to the second request, and indicating, after detecting the second source voltage detection value of the first end of the charging cable, the second source voltage detection value to the electronic device.

In a possible design manner of the sixth aspect, an absolute value of a difference between the first current value and the second current value is less than two times the first current value, and the absolute value of the difference between the first current value and the second current value is less than two times the second current value.

According to a seventh aspect, this application provides a computer-readable storage medium, including computer instructions, where the computer instructions, when run on an electronic device, cause the electronic device to perform the method for detecting impedance of a charging cable described in any one of the first aspect.

According to an eighth aspect, this application provides a computer-readable storage medium, including computer instructions, where the computer instructions, when run on a power supply device, cause the power supply device to perform the method for detecting impedance of a charging cable described in any one of the second aspect.

According to a ninth aspect, this application provides a computer program product including instructions, where the computer program product, when run on a computer, causes the computer to perform the method for detecting impedance of a charging cable according to any one of the first aspect.

According to a tenth aspect, this application provides a computer program product including instructions, where the computer program product, when run on a computer, causes the computer to perform the method for detecting impedance of a charging cable according to any one of the second aspect.

According to an eleventh aspect, this application provides a charging system. The system includes a charging cable, the electronic device according to the third aspect, and the power supply device according to the fifth aspect, or the system includes a charging cable, the electronic device according to the fourth aspect, and the power supply device according to the sixth aspect.

For technical effects brought by any design manner of the second to the ninth aspects, refer to technical effects brought by different design manners of the first aspect and the second aspect. Details are not described herein again.

DETAILED DESCRIPTION OF ILLUSTRATIVE EMBODIMENTS

Figures 1, 2:
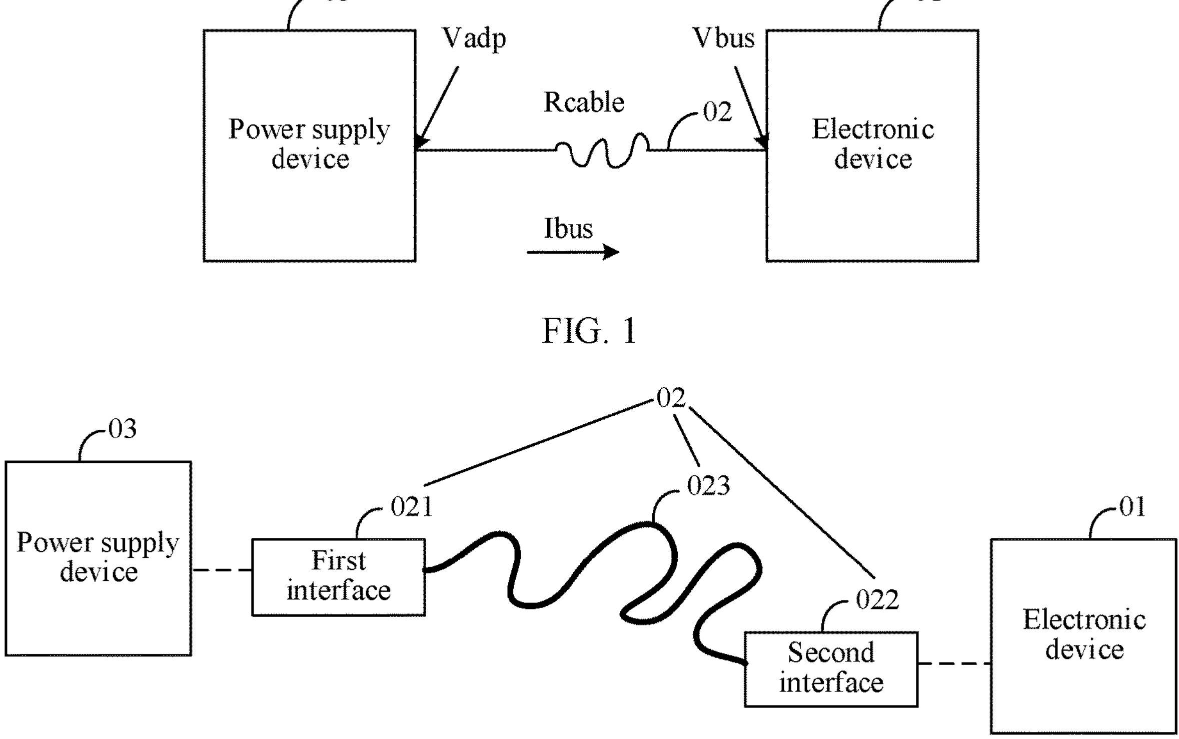
FIG. 1 is a schematic structural diagram of a charging system according to an embodiment of this application.
FIG. 2 is a schematic structural diagram of a charging cable according to an embodiment of this application.

The terms "first" and "second" mentioned below are merely intended for a purpose of description, and shall not be understood as an indication or implication of relative importance or implicit indication of the quantity of indicated technical features. Therefore, features defining "first" and "second" may explicitly or implicitly include one or more such features. In the descriptions of the embodiments, unless otherwise stated, "a plurality of" means two or more.

First, related technical terms included in this application are described.

Universal Serial Bus (universal serial bus, USB): USB is a transport standard (or referred to as a transport protocol). USB transport protocols mainly include the following: the USB 1.0 protocol, the USB 2.0 protocol, the USB 3.0 protocol, the USB 3.1 protocol, and the like. The USB 1.0 protocol and the USB 2.0 protocol are older protocols with lower transmission speeds.

The USB 2.0 protocol and the USB 3.0 protocol are transport protocols currently widely applied. For example, USB 2.0 and USB 3.0 are used in combination in devices such as notebook computers, USB flash disks, and mobile hard disks. The USB 3.1 protocol is a new USB transport protocol and is an upgraded version of USB 3.0. Compared with the USB 1.0 protocol, the USB 2.0 protocol, and the USB 3.0 protocol, the USB 3.1 protocol has the highest transmission speed. After the upgrade, USB 3.1 may be specifically divided into USB 3.1 Gen1 and USB 3.1 Gen2 according to transmission rates. USB 3.1 Gen1 is usually referred to as USB 3.0.

Type-C: Type-C is an interface standard (that is, an interface type).

An actual Type-C interface can use any USB transport protocol such as the USB 2.0 protocol, the USB 3.0 protocol, or the USB 3.1 protocol. Moreover, the USB transport protocol can also support a plurality of interface types. For example, the USB 3.1 protocol can support USB Type A, USB Type B, and USB Type-C interface types. The Type-C interface using the USB 3.1 protocol (that is, the USB Type-C interface) has a higher transmission speed.

With the development of electronic technologies, electronic devices have an increasingly quantity of functions, and users use electronic devices more frequently and for longer times. Batteries of electronic devices (for example, mobile phones or smart wearable devices) have limited storage capabilities. Therefore, to enable the electronic devices to serve users for longer times, currently, most electronic devices have the quick charging (QC for short below) function. Specifically, an electronic device is connected to a power supply device (for example, a switch power adapter) by a charging cable, and may communicate with the power supply device, to negotiate a charging voltage or a charging current at which the power supply device charges the electronic device. When the power supply device charges the electronic device with a high voltage or a high current, it may be referred to as quick charging.

During charging, the voltage and current of quick charging are both greater than those of ordinary charging. Therefore, quick charging requires that impedance of the charging cable is less than a preset threshold (for example, 300 mΩ). Based on this, the existing electronic device with the quick charging function proactively monitors the impedance of the charging cable when being connected to the power supply device through the charging cable and starting to be charged, and negotiates using the quick charging function with the power supply device only when the impedance of the charging cable is less than a preset threshold.

Specifically, referring to FIG. 1, in an existing impedance detection solution, after an electronic device 01 is connected to a power supply device 03 by a charging cable 02, the electronic device 01 first communicates with the power supply device 03, to cause the power supply device 03 to provide electric energy at an initial voltage and a constant current to the electronic device 01 through the charging cable 02. Then, the electronic device 01 may communicate with the power supply device 03 to obtain an output voltage Vadp (that is, the initial voltage) of the power supply device 03. In addition, the electronic device 01 can obtain an input voltage Vbus inputted by the power supply device 03 to the electronic device 01. Then, the electronic device 01 may calculate a difference between Vadp and Vbus (Vadp−Vbus). Then, based on Ohm's law, the electronic device 01 can use (Vadp−Vbus) and Ibus to calculate the impedance Rcable of the charging cable. Specifically, Rcable=(Vadp−Vbus)/Ibus.

However, when Vadp and Vbus are obtained, because the accuracy of the existing voltage detection technology is not enough, and there is usually an error of ±1%, a finally calculated Rcable is not accurate enough. Using an example in which Ibus is 1 A (ampere, A), an exact value of Vadp is 10.5 V, a detection value of Vadp is 10.4 V, an exact value and a detection value of Vbus are both 10.3 V, an exact value of Rcable is 0.2Ω, and a calculated value of Rcable is 0.1Ω. It can be learned that an error of Rcable is 100 mΩ, and usually, quick charging function requires the impedance of the charging cable to be less than 300 mΩ, and the error of 100 mΩ is too large for such a threshold.

It can be concluded that the existing method for detecting impedance is likely to cause the electronic device 01 to negotiate, in a case that the impedance of the charging cable is greater than 300 mΩ, with the power supply device 03 to use quick charging, which is a safety hazard, or cause the electronic device 01 to negotiate, in a case that the impedance of the charging cable is less than 300 mΩ, with the power supply device 03 to use ordinary charging, which lowers the charging efficiency. That is, the existing impedance detection solution may prevent the electronic device from negotiating the most appropriate charging mode with the power supply device, and further affect the charging safety or charging efficiency of the electronic device.

It can be learned from the defects of the prior art that how to prevent impact of the error of voltage detection in an impedance detection process is a problem that needs to be resolved. Based on this, the embodiments of this application provide a method for detecting impedance of a charging cable. The electronic device can measure voltage values (such as Vbus_detection_xA and Vadp_detection_xA, as well as Vbus_detection_yA and Vadp_detection_yA) of both ends of the charging cable when the power supply device supplies power to the electronic device with two different types of constant voltage and constant current electric energy (for example, 10 V x A electric energy and 10 V y A electric energy) through the charging cable respectively. Because the impedance of the charging cable itself is very small (milliohm level), and the same detection method is used for voltage detection, the error of voltage detection is slightly affected by the current, and all the measurements have the same error rate.

Based on this, it can be learned that if currents corresponding to two measurements are not greatly different (a difference between the two current values does not exceed two times either of the current values), two measurements of voltages of an end of the charging cable connected to the power supply device have the same error, and two measurements of voltages of the end of the charging cable connected to the electronic device have the same error or errors that have only a slight difference. In this way, it can be considered that voltage differences between two ends of the charging cable obtained through two measurements have the same error value. That is, voltages that are carried by the charging cable and that are obtained through two measurements and calculations have the same error. Therefore, based on this, two sets of voltage values obtained through the foregoing two measurements can be used, to calculate the impedance of the charging cable more accurately. Further, effective data support is also provided for a mobile phone to negotiate with the switch power adapter to select a correct charging mode, thereby ensuring that the mobile phone and the switch power adapter can negotiate the most appropriate charging mode, and improving the charging safety and charging efficiency of the mobile phone.

The method for detecting impedance of a charging cable provided in the embodiments of this application can be applied to the charging system shown in FIG. 1. The system may include a power supply device 03, a charging cable 02, and an electronic device 01. When the power supply device 03 charges the electronic device 01 through the charging cable 02, a voltage of an end of the power supply device 03 connected to the charging cable 02 is denoted as Vadp, a current on the charging cable 02 is denoted as Ibus, impedance of the charging cable 02 is denoted as Rcable, and an end of the charging cable 02 connected to the electronic device is denoted as Vbus.

Referring to FIG. 2, the charging cable 02 may include a first interface 021, a wire 023, and a second interface 022. The first interface 021 is configured to connect to a specific interface of the power supply device 03, and the second interface 022 is configured to connect to a charging interface of the electronic device. After the charging cable 02 is connected to the power supply device 03 and the electronic device 01 by the first interface 021 and the second interface 022 thereof respectively, the charging cable 02 may be configured to transmit electric energy and data, to provide physical support for the function of charging the electronic device 01 by the power supply device 03 and the function of communicating with each other.

Figure 3:
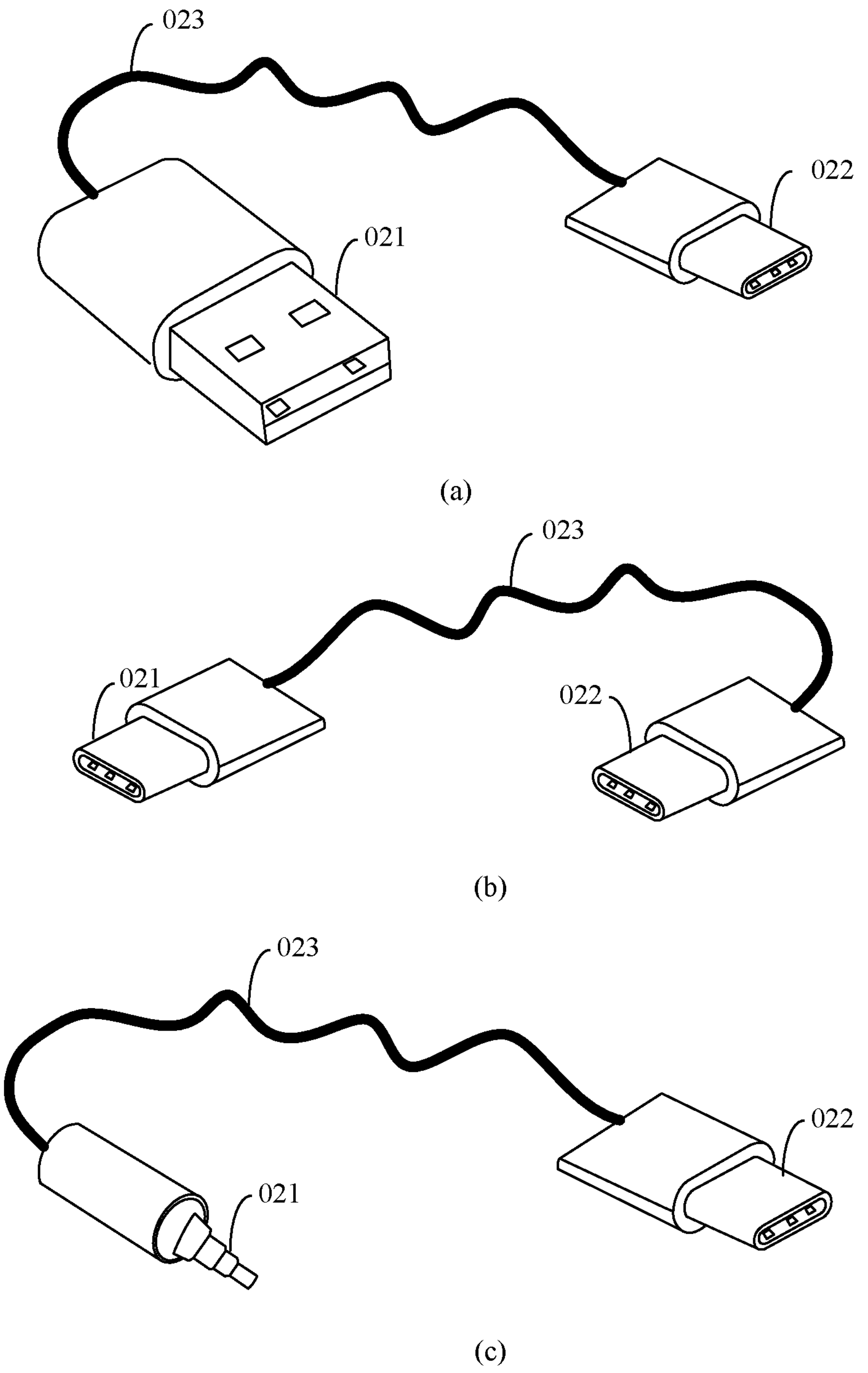
FIG. 3 is a schematic diagram of three possible product forms of a charging cable according to an embodiment of this application.

For example, the charging cable 02 in practice may include the following: a charging cable of which the first interface 021 is a Type-A interface and the second interface 022 is a Type-C interface shown in FIG. 3(*a*); a charging cable of which the first interface 021 and the second interface 022 are both Type-C interfaces shown in FIG. 3(*b*); and a charging cable of which the first interface 021 is a headset jack and the second interface is a Type-C interface shown in FIG. 3(*c*). Certainly, there may be any other feasible charging cable in practice, which is not specifically limited in this application.

In the embodiments of this application, because only the Type-C interface in practice can support the interface protocol required by quick charging, the charging interface of the electronic device supporting the quick charging function is a Type-C interface. Therefore, the charging cable 02 in the embodiments of this application may be a charging cable of which the second interface 022 is a Type-C interface and the first interface is any feasible interface.

It should be noted that in this application embodiment, the first interface 021 of the charging cable 02 and a specific interface of the power supply device 03 should be interfaces conforming to the same interface standard. The second interface 022 of the charging cable 02 and a charging interface of the electronic device 01 should be interfaces conforming to the same interface standard. Usually, the first interface 021 can be referred to as an xx male connector, a specific interface of the power supply device 03 corresponding to the first interface 021 can be referred to as an xx female connector, the second interface 022 can be referred to as a yy male connector, and a charging interface of the electronic device 01 corresponding to the second interface 022 can be referred to as a yy female connector. xx is an interface type of the first interface 021 and the specific interface, and yy is an interface type of the second interface 022 and the charging interface. Using an example in which the first interface 021 is a Type-A interface, that is, the interface type xx of the first interface 021 and the specific interface is Type-A, and the second interface 022 is a Type-C interface, that is, the interface type yy of the second interface 022 and the charging interface is Type-C: the first interface 021 can be referred to as a Type-A male connector, and the specific interface of the power supply device 03 corresponding to the first interface 021 can be referred to as a Type-A female connector, the second interface 022 can be referred to as a Type-C male connector, and the charging interface of the electronic device 01 corresponding to the second interface 022 can be referred to as a Type-C female connector.

In the embodiments of this application, the power supply device 03 may be a device supplying power to the electronic device 01 and communicating with the electronic device 01 through a specific interface (for example, a Type-A interface) and a charging cable.

Figure 4:
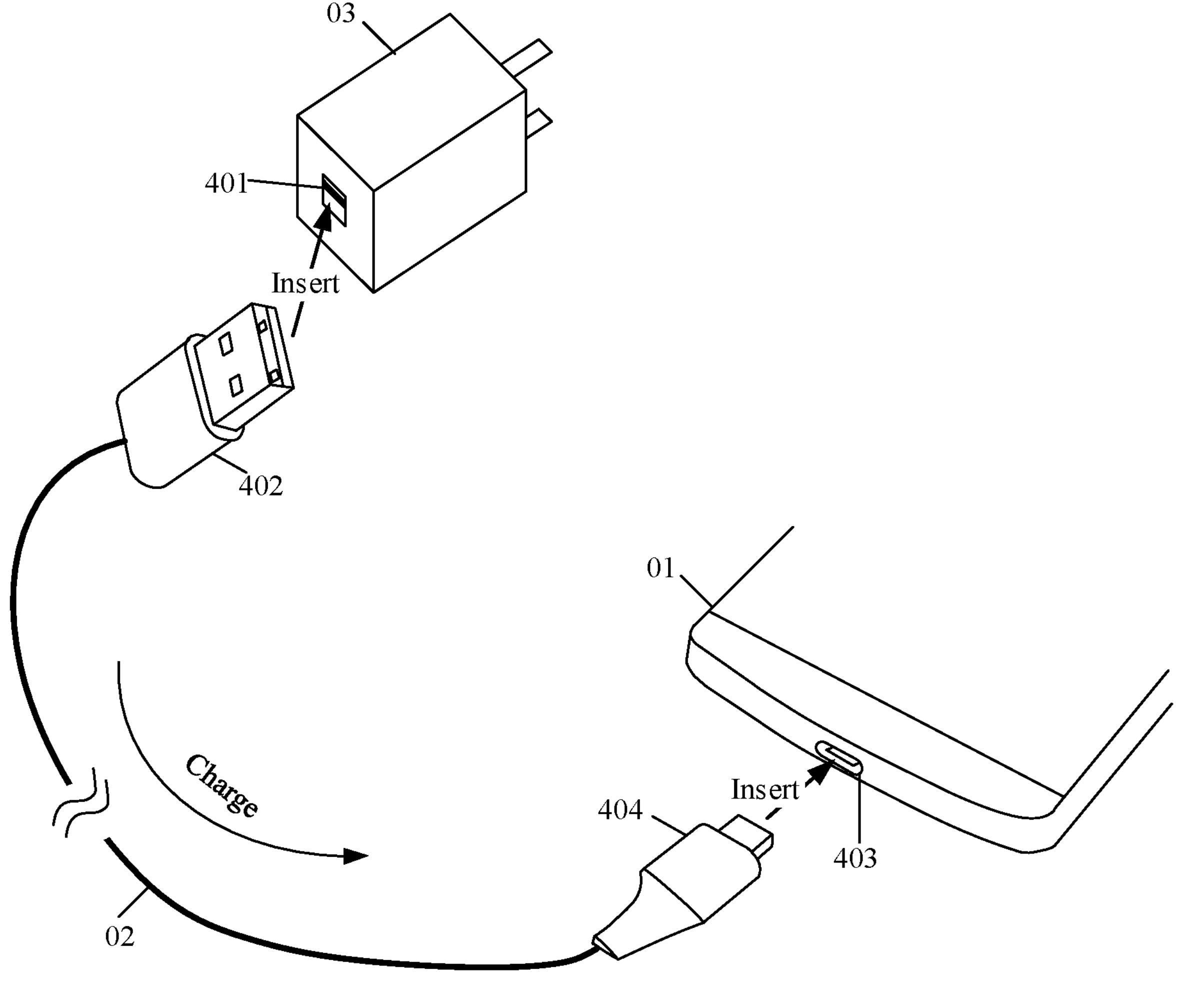
FIG. 4 is a structure schematic diagram of another charging system according to an embodiment of this application.

For example, referring to FIG. 4, the power supply device 03 may be a switch power adapter matching the electronic device 01 when the electronic device 01 is sold. A plug of the switch power adapter is inserted into a jack of a socket connected to the mains. If a specific interface of the switch power adapter is connected to the electronic device 01 by the charging cable 02, the switch power adapter can negotiate with the electronic device 01 to determine a specific current and a specific voltage for charging the electronic device 01. Referring to FIG. 4, if the specific interface of the switch power adapter can be a Type-A female connector 401, the first interface of the charging cable 02 connected (specifically, plugged) to the specific interface can be a Type-A male connector 402.

Figure 5:
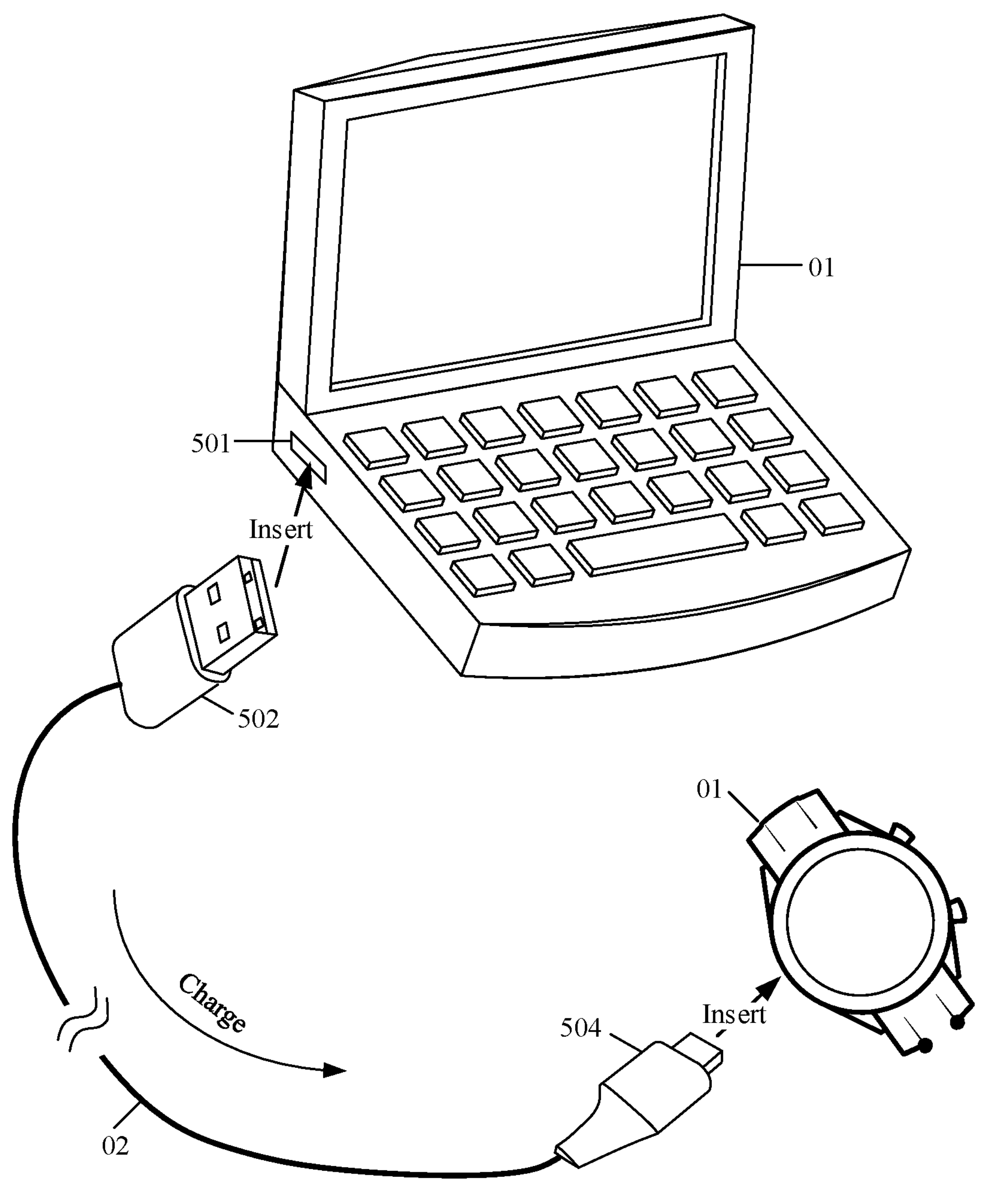
FIG. 5 is a schematic structural diagram of still another charging system according to an embodiment of this application.

The power supply device may also be another device such as a notebook computer that can supply power and communicate with an electronic device through a charging cable. After a specific interface of another device, such as a notebook computer, is connected to an electronic device by a charging cable, the another device can negotiate with the electronic device to determine a specific current and a specific voltage for charging the electronic device with electric energy provided by the another device. For example, using an example in which the power supply device is a notebook computer, referring to FIG. 5, if a specific interface of the notebook computer can be a Type-A female connector 501, the first interface of the charging cable 02 connected (specifically, plugged) to the specific interface can be a Type-A male connector 502.

For example, the electronic device may be a device including a Type-C female connector that can be used for charging, such as a mobile phone, a tablet computer, a wearable device (for example, a smartwatch, a wireless headset, smart glasses, or a helmet), a desktop computer, a laptop computer, a handheld computer, a notebook computer, an ultra-mobile personal computer (ultra-mobile personal computer, UMPC), a netbook, a cellular phone, a personal digital assistant (personal digital assistant, PDA), or an augmented reality (augmented reality, AR)/virtual reality (virtual reality, VR) device. A specific form of the electronic device is not particularly limited in the embodiments of this application. For example, in FIG. 4, using the electronic device 01 being a mobile phone as an example, the mobile phone includes a Type-C female connector 403, and a second interface corresponding to the charging cable 02 is a Type-C male connector 404. In another example, in FIG. 5, using the electronic device 01 being a wearable smartwatch as an example, the wearable smartwatch includes a Type-C female connector (not shown in the figure), and a second interface corresponding to the charging cable 02 is a Type-C male connector 504.

Figure 6:
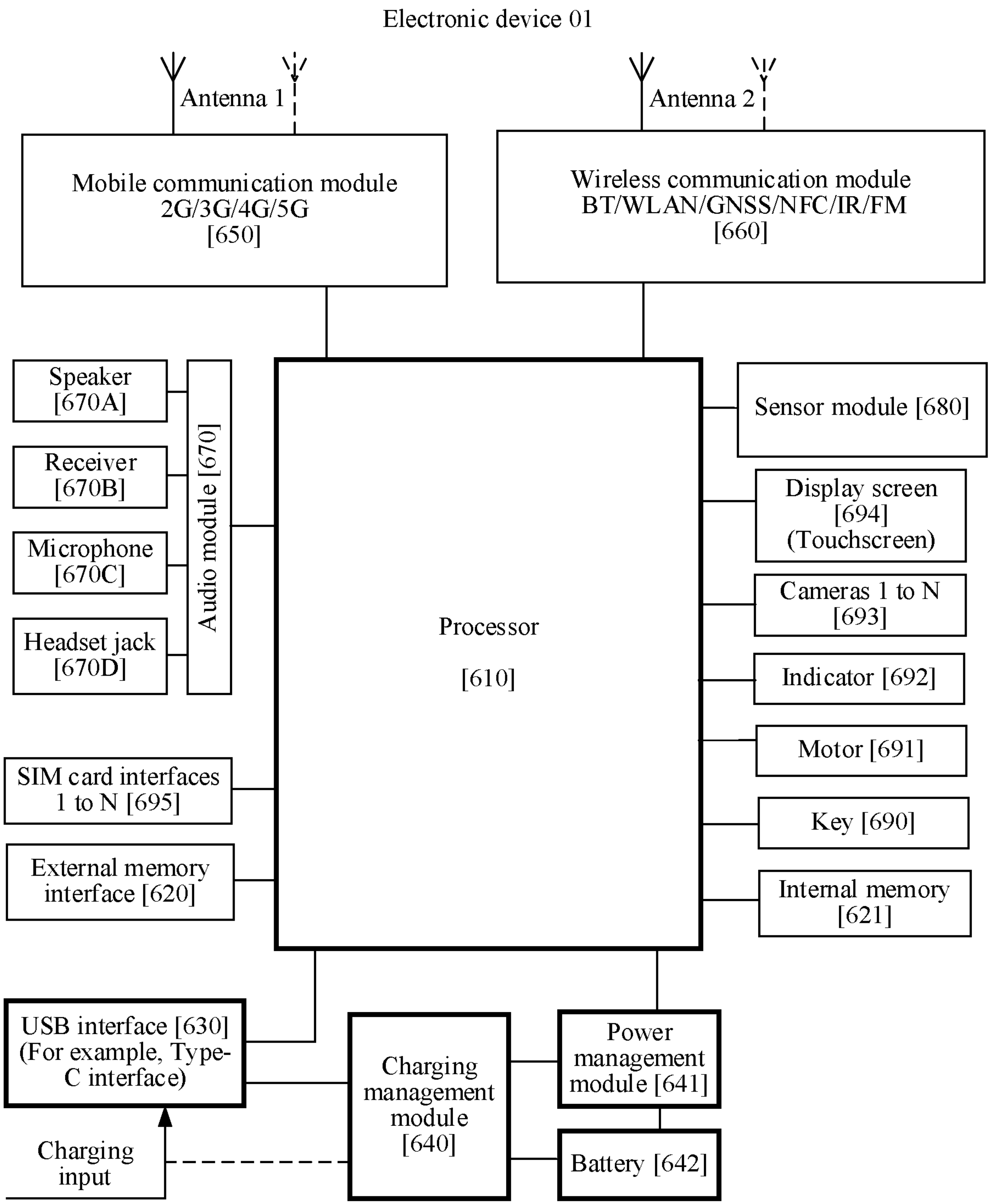
FIG. 6 is a schematic structural diagram of an electronic device according to an embodiment of this application.

Using the electronic device being a mobile phone as an example, FIG. 6 shows a schematic diagram of a hardware structure of the electronic device 01. As shown in FIG. 6, the electronic device 01 may include a processor 610, an external memory interface 620, an internal memory 621, a USB interface 630, a charging management module 640, a power management module 641, a battery 642, an antenna 1, an antenna 2, a mobile communication module 650, a wireless communication module 660, and an audio module 670, a speaker 670A, a telephone receiver 670B, a microphone 170C, a headset jack 170D, a sensor module 680, a button 690, a motor 691, an indicator 692, a camera 693, a display screen 694, a subscriber identity module (subscriber identification module, SIM) card interface 695, and the like. The USB interface 630 is a Type-C interface. The Type-C interface is a Type-C female connector (also referred to as a Type-C female socket). A Type-C male connector of the charging cable 02 may be plugged to the Type-C female connector.

The sensor module 680 may include a sensor such as a pressure sensor, a gyroscope sensor, a barometric pressure sensor, a magnetic sensor, an acceleration sensor, a distance sensor, an optical proximity sensor, a fingerprint sensor, a temperature sensor, and a touch sensor, an ambient light sensor, and a bone conduction sensor.

It may be understood that the schematic structure in this embodiment constitutes no specific limitation on the electronic device 01. In some other embodiments, the electronic device 01 may include more or fewer components than those shown in the figure, or some components may be combined, or some components may be split, or components are arranged in different manners. The components in the figure may be implemented by hardware, software, or a combination of software and hardware.

The processor 610 may include one or more processing units. For example, the processor 610 may include an application processor (application processor, AP), a modem processor, a graphics processing unit (graphics processing unit, GPU), an image signal processor (image signal processor, ISP), a controller, a memory, a video codec, a digital signal processor (digital signal processor, DSP), a baseband processor, and/or a neural-network processing unit (neural-network processing unit, NPU), and the like. Different processing units may be independent components, or may be integrated into one or more processors.

The controller may be a nerve center and a command center of the electronic device 01. The controller may generate an operation control signal based on an instruction operation code and a timing signal, and read an instruction and control execution of the instruction.

A memory may be further configured in the processor 610, to store instructions and data. In some embodiments, the memory in the processor 610 is a cache. The memory may store an instruction or data that has just been used or cyclically used by the processor 610. If the processor 610 needs to use the instruction or the data again, the processor may directly invoke the instruction or the data from the memory, to avoid repeated access, and reduce a waiting time of the processor 610, thereby improving system efficiency.

In some embodiments, the processor 610 may include one or more interfaces. The interface may include an integrated circuit (inter-integrated circuit, I2C) interface, an integrated circuit sound (inter-integrated circuit sound, I2S) interface, a pulse code modulation (pulse code modulation, PCM) interface, a universal asynchronous receiver/transmitter (universal asynchronous receiver/transmitter, UART) interface, a mobile industry processor interface (mobile industry processor interface, MIPI), a general-purpose input/output (general-purpose input/output, GPIO) interface, a subscriber identity module (subscriber identity module, SIM) interface, a universal serial bus (universal serial bus, USB) interface, and/or the like.

It may be understood that a schematic interface connection relationship between the modules in this embodiment is merely an example for description, and constitutes no limitation on the structure of the electronic device 01. In some other embodiments, the electronic device 01 may alternatively use an interface connection manner different from that in the foregoing embodiment, or use a combination of a plurality of interface connection manners.

The charging management module 640 is configured to receive a charging input from a charger. The charger may be a wireless charger or may be a wired charger. In some embodiments of wired charging, the charging management module 640 may receive a charging input of a wired charger by using the USB interface 630. The USB interface 630 is a Type-C female connector, and a Type-C male connector of the charging cable 02 may be plugged to the USB interface. The charging management module 640 can receive a charging input inputted by a charger (that is, the foregoing power supply device, such as a switch power adapter or a notebook computer) through the charging cable 02 to the USB interface 630. In some embodiments of wireless charging, the charging management module 640 may receive a wireless charging input by using a wireless charging coil of the electronic device 01. The charging management module 640 may further supply power to the electronic device by using the power management module 641 while charging the battery 642.

The power management module 641 is configured to connect to the battery 642, the charging management module 640, and the processor 610. The power management module 641 receives input from the battery 642 and/or the charging management module 640, to supply power to the processor 610, the internal memory 621, an external memory, the display screen 694, the camera 693, the wireless communication module 660, and the like. The power management module 641 may be further configured to monitor parameters such as a battery capacity, a battery cycle count, and a battery state of health (electric leakage and impedance). In some other embodiments, the power management module 641 may be alternatively configured in the processor 610. In some other embodiments, the power management module 641 and the charging management module 640 may further be configured in the same device.

A wireless communication function of the electronic device 01 may be implemented by using the antenna 1, the antenna 2, the mobile communication module 650, the wireless communication module 660, the modem processor, the baseband processor, and the like. In some embodiments, the antenna 1 and the mobile communication module 650 of the electronic device 01 are coupled, and the antenna 2 and the wireless communication module 660 of the electronic device 01 are coupled, so that the electronic device 01 can communicate with a network and another device by using a wireless communication technology.

The electronic device 01 implements a display function by using the GPU, the display screen 694, the application processor, and the like. The GPU is a microprocessor for image processing, and is connected to the display screen 694 and the application processor. The GPU is configured to perform mathematical and geometric calculation, and is configured to render graphics. The processor 610 may include one or more GPUs, and execute program instructions to generate or change display information.

The display screen 694 is configured to display an image, a video, and the like. The electronic device 01 can implement a photographing function by using the ISP, the camera 693, the video codec, the GPU, the display screen 694, the application processor, and the like.

The external memory interface 620 may be configured to be connected to an external storage card such as a micro SD card, to expand a storage capability of the electronic device 01. The internal memory 621 may be configured to store computer executable program code, and the executable program code includes instructions. The processor 610 runs the instruction stored in the internal memory 621, to perform various function applications and data processing of the electronic device 01. For example, in this embodiment of this application, the processor 610 can execute the instructions stored in the internal memory 621, and the internal memory 621 may include a program storage region and a data storage region.

The electronic device 01 may use the audio module 670, the speaker 670A, the telephone receiver 670B, the microphone 170C, the headset jack 170D, the application processor, and the like, to implement an audio function, for example, music playback or recording.

Figure 7:
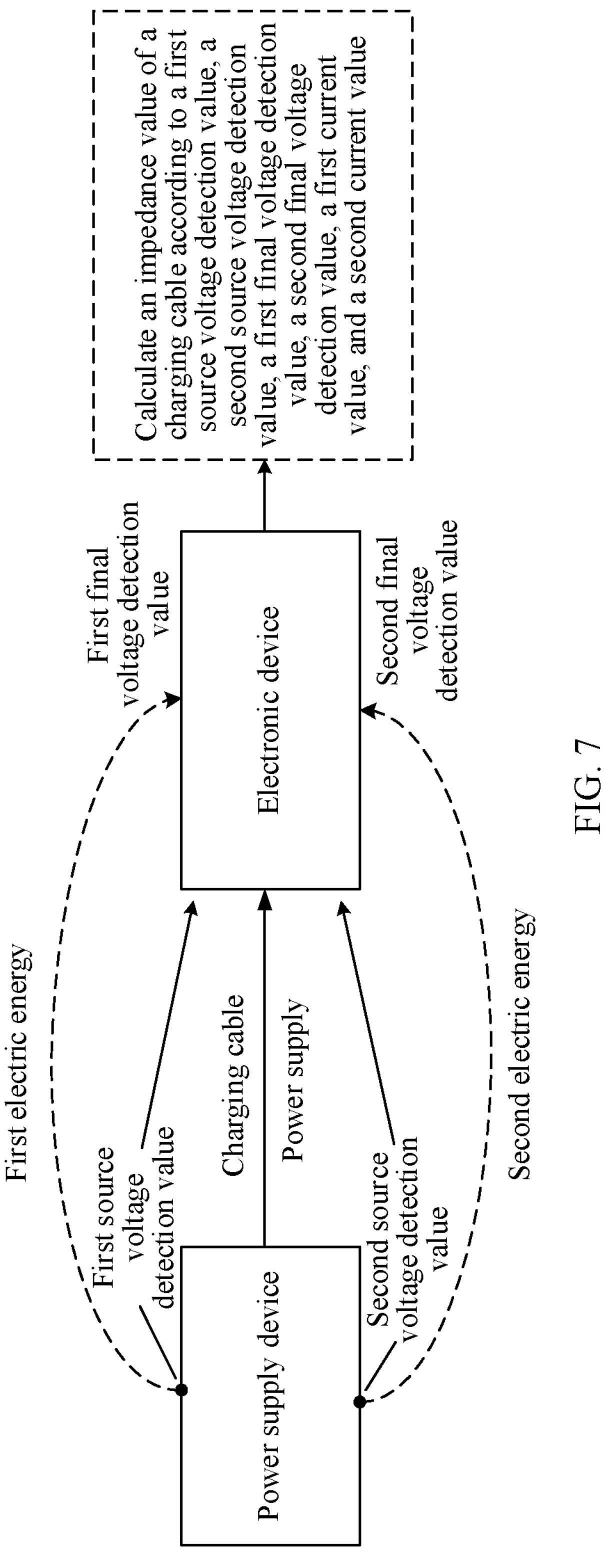
FIG. 7 is a schematic flowchart of a method for detecting impedance of a charging cable according to an embodiment of this application.

Based on the charging system shown in FIG. 1, the embodiments of this application provide a method for detecting impedance of a charging cable. As shown in FIG. 7, the electronic device first receives first electric energy from the power supply device through the charging cable, and obtains a first source voltage detection value of the first end of the charging cable and a first final voltage detection value of the second end of the charging cable. A voltage of the first electric energy is constant, and a current of the first electric energy is a first current value. Then, the electronic device receives second electric energy from the power supply device through the charging cable, and obtains a second source voltage detection value of the first end of the charging cable and a second final voltage detection value of the second end of the charging cable. A voltage of the second electric energy is the same as the voltage of the first electric energy, and a current of the second electric energy is a second current value. Finally, the electronic device may calculate an impedance value of the charging cable according to the first source voltage detection value, the second source voltage detection value, the first final voltage detection value, the second final voltage detection value, the first current value, and the second current value. In this way, because the preset formula used in the entire detection and calculation process for the impedance value of the charging cable is deducted by taking the voltage detection error in to consideration, and parameters (the first source voltage detection value, the second source voltage detection value, the first final voltage detection value, and the second final voltage detection value) required for the calculation are directly detected, the impedance value of the charging cable can be calculated quickly and accurately. Effective data support is also provided for a mobile phone to negotiate with the switch power adapter to select a correct charging mode, thereby ensuring that the mobile phone and the switch power adapter can negotiate the appropriate charging mode, and improving the charging safety and charging efficiency of the mobile phone.

Using an example in which the electronic device is a mobile phone 01A, and the power supply device is a switch power adapter 03A connected to the power supply, the method of the embodiments of this application is introduced.

Figure 8:
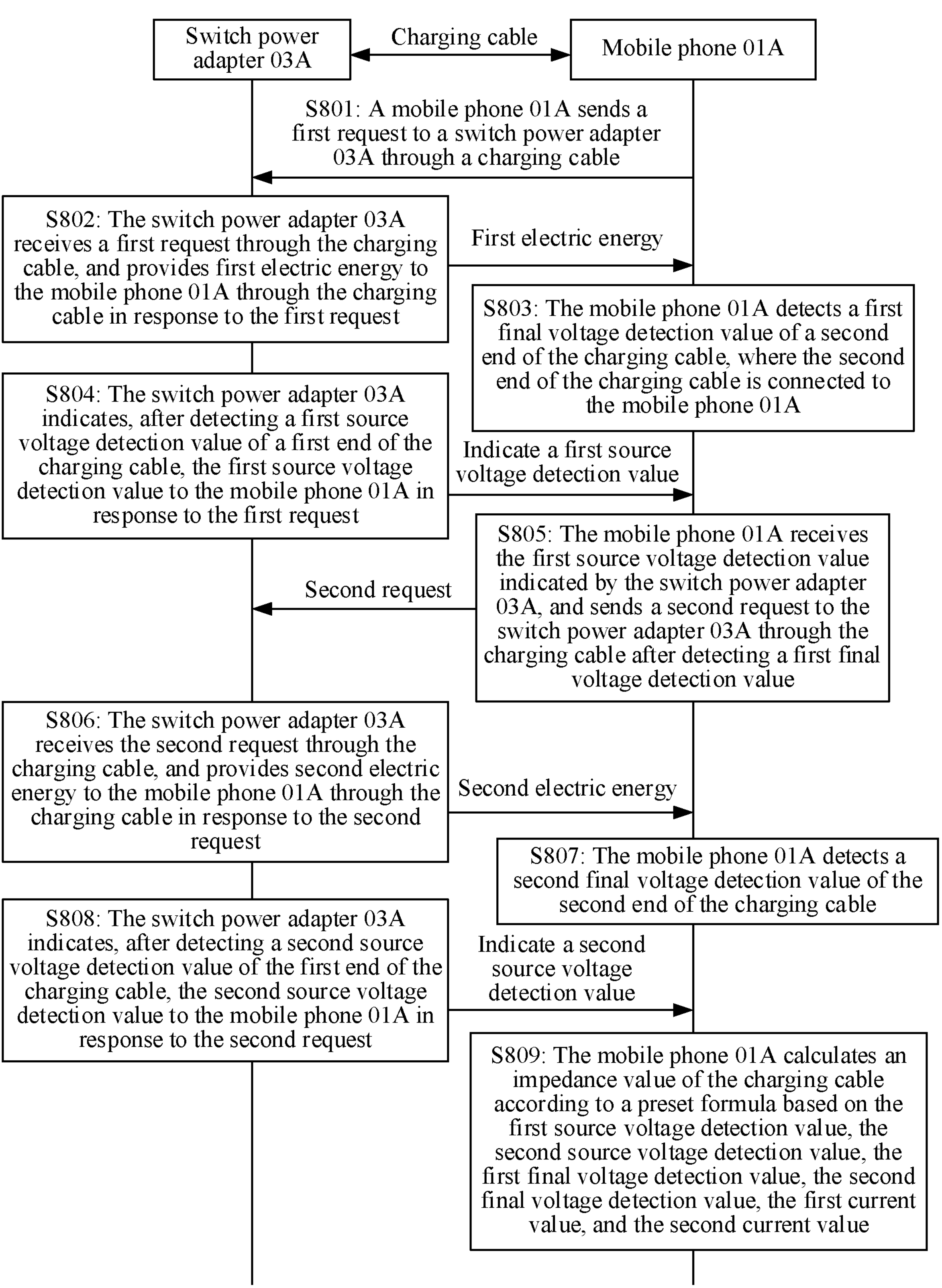
FIG. 8 is a schematic flowchart of another method for detecting impedance of a charging cable according to an embodiment of this application.

Referring to FIG. 8, the method for detecting impedance of a charging cable provided in this embodiment of this application may include S801 to S809:

S801: A mobile phone 01A sends a first request to a switch power adapter 03A through a charging cable.

The first request is used for requesting the switch power adapter 03A to provide first electric energy of which a voltage value is constant and a current value is a first current value (for example, x A) to the mobile phone 01A through the charging cable and requesting the switch power adapter 03A to indicate a first source voltage detection value of a first end of the charging cable to the mobile phone 01A. The first end of the charging cable is connected to the switch power adapter 03A. When the switch power adapter 03A provides the first electric energy to the mobile phone 01A through the charging cable, the voltage detection value of the first end of the charging cable is referred to as the first source voltage detection value (denoted as Vadp_detection_xA).

The premise for execution of step S801 is that a plug of the switch power adapter 03A has been plugged into a live socket, and the switch power adapter 03A is connected to the mobile phone 01A by the charging cable to supply power to the mobile phone 01A. When the mobile phone 01A detects that the switch power adapter 03A supplies power to the mobile phone 01A through charging cable, step S801 is performed.

The first source voltage detection value of the first end of the charging cable connected to the mobile phone 01A is a voltage detection value of the first interface of the charging cable mentioned in this embodiment in a case that the power supply device provides first electric energy to the electronic device through the charging cable.

S802: The switch power adapter 03A receives a first request through the charging cable, and provides first electric energy to the mobile phone 01A through the charging cable in response to the first request.

Based on S802, the mobile phone 01A can receive the first electric energy from the power supply device through the charging cable.

S803: The mobile phone 01A detects a first final voltage detection value of a second end of the charging cable, where the second end of the charging cable is connected to the mobile phone 01A.

The first final voltage detection value of the second end of the charging cable connected to the mobile phone 01A is a voltage detection value of the second interface of the charging cable mentioned in this embodiment in a case that the power supply device provides first electric energy to the electronic device through the charging cable. Based on this, the mobile phone 01A should detect a first final voltage detection value (denoted as Vbus_detection_xA) in a case that the mobile phone 01A has received first electric energy from the switch power adapter 03A through the charging cable. Specifically, how to detect the first final voltage detection value depends on an actual situation. For example, the mobile phone 01A performs detection through a voltage detection circuit configured thereon. A specific detection method is not limited in this application.

S804: The switch power adapter 03A indicates, after detecting a first source voltage detection value of a first end of the charging cable, the first source voltage detection value to the mobile phone 01A in response to the first request.

The switch power adapter 03A should perform the action of detecting the first source voltage detection value after the switch power adapter 03A provides the first electric energy to the mobile phone 01A. Specifically, how to detect the first source voltage detection value depends on an actual situation. For example, the switch power adapter 03A performs detection through a voltage detection circuit configured thereon. A specific detection method is not limited in this application.

A specific manner in which the switch power adapter indicates the first source voltage detection value to the mobile phone 01A may be sending a voltage value, that is, the first source voltage detection value, to the mobile phone 01A, or sending indication information carrying the first source voltage detection value to the mobile phone 01A. Certainly, there may also be any other feasible manner in practice, which is not specifically limited in this application.

It should be noted that steps S803 and S804 do not necessarily have a sequential relationship, and may be performed simultaneously or sequentially in practices, which is not specifically limited in this application.

Based on S801 to S804, the mobile phone 01A can receive first electric energy from the switch power adapter 03A through the charging cable, and obtain a first source voltage detection value of the first end of the charging cable and a first final voltage detection value of the second end of the charging cable. The mobile phone 01A may send a first request to the switch power adapter 03A through the charging cable when detecting that the switch power adapter 03A starts to supply power to the mobile phone 01A, so that the switch power adapter 03A can detect a first source voltage detection value and indicates the first source voltage detection value to the mobile phone 01A after providing first electric energy to the mobile phone 01A. In addition, the mobile phone 01A can detect a first final voltage detection value at the same time. In this way, the first request is sent by the mobile phone 01A to the switch power adapter 03A through the charging cable, the first source voltage detection value is indicated by the switch power adapter 03A to the mobile phone 01A through the charging cable, and the speed of wired communication is very high. Therefore, the mobile phone 01A can quickly obtain the first source voltage detection value and the first final voltage detection value, to data support for subsequent calculation of the impedance of the charging cable.

S805: The mobile phone 01A receives the first source voltage detection value indicated by the switch power adapter 03A, and sends a second request to the switch power adapter 03A through the charging cable after detecting a first final voltage detection value.

The second request is used for requesting the switch power adapter 03A to provide second electric energy of which a voltage value is equal to that of the first electric energy and a constant current value is a second current value (denoted as yA) to the mobile phone 01A through the charging cable and sending a second source voltage detection value (denoted as Vadp_detection_yA) of a first end of the charging cable connected to the switch power adapter 03A to the mobile phone 01A.

In addition, the technical solutions provided in this application are carried out based on the principle that when the first electric energy and the second electric energy pass through the charging cable, errors of voltage detection at both ends of the charging cable are the same. Moreover, the impedance of the charging cable itself is very small (milliohm level), and the same detection method is used for voltage detection. In addition, the voltages (voltages inputted to an end of the charging cable connected to the power supply device) of the first electric energy and the second electric energy are the same. Therefore, to prevent errors of voltage detection in two measurements from being affected by different current values in the two measurements, the first current value cannot be greatly different from the second current value. Therefore, to ensure that the impact of the current on voltage detection is very small, an absolute value of a difference between the first current value and the second current value is less than two times the first current value and less than two times the second current value.

The second source voltage detection value of the first end of the charging cable connected to the switch power adapter 03A is a voltage detection value of the first interface of the charging cable mentioned in this embodiment in a case that the power supply device provides second electric energy to the electronic device through the charging cable.

An objective of S805 is to enable the electronic device to send a second request to the power supply device through the charging cable after obtaining the first source voltage detection value and the first final voltage detection value. In this way, it is ensured that the electronic device can obtain the first source voltage detection value and the first final voltage detection value before obtaining the second source voltage detection value and the second final voltage detection value. Further, the integrity of the data that is required during subsequent calculation of the impedance of the charging cable is ensured.

S806: The switch power adapter 03A receives the second request through the charging cable, and provides second electric energy to the mobile phone 01A through the charging cable in response to the second request.

S807: The mobile phone 01A detects a second final voltage detection value of the second end of the charging cable.

The second final voltage detection value of the second end of the charging cable connected to the mobile phone 01A is a voltage detection value of the second interface of the charging cable mentioned in this embodiment in a case that the power supply device provides second electric energy to the electronic device through the charging cable. Based on this, the mobile phone 01A should detect a second final voltage detection value (denoted as Vbus_detection_yA) in a case that the mobile phone 01A has received second electric energy from the switch power adapter 03A through the charging cable. Specifically, how to detect the first final voltage detection value depends on an actual situation. For example, the mobile phone 01A performs detection through a voltage detection circuit configured thereon. A specific detection method is not limited in this application.

S808: The switch power adapter 03A indicates, after detecting a second source voltage detection value of the first end of the charging cable, the second source voltage detection value to the mobile phone 01A in response to the second request.

The switch power adapter 03A should perform the action of detecting the second source voltage detection value after the switch power adapter 03A provides the second electric energy to the mobile phone 01A. For how to specifically detect the second source voltage detection value, refer to the method for detecting the first source voltage detection value. Details are not described herein again.

Based on S805 to S808, the mobile phone 01A can receive second electric energy from the switch power adapter 03A through the charging cable, and obtain a second source voltage detection value of the first end of the charging cable and a second final voltage detection value of the second end of the charging cable. Based on this, the mobile phone 01A may send a second request to the switch power adapter 03A through the charging cable after obtaining the first source voltage detection value and the first final voltage detection value, so that the switch power adapter 03A can detect a second source voltage detection value and indicates the second source voltage detection value to the mobile phone 01A after providing second electric energy to the mobile phone 01A. In addition, the mobile phone 01A can detect a second final voltage detection value at the same time. In this way, the second request is sent by the mobile phone 01A to the switch power adapter 03A through the charging cable, the first source voltage detection value is indicated by the switch power adapter 03A to the mobile phone 01A through the charging cable, and the speed of wired communication is very high. Therefore, the mobile phone 01A can quickly obtain the second source voltage detection value and the second final voltage detection value, to data support for subsequent calculation of the impedance of the charging cable.

S809: The mobile phone 01A calculates an impedance value of the charging cable according to a preset formula based on the first source voltage detection value, the second source voltage detection value, the first final voltage detection value, the second final voltage detection value, the first current value, and the second current value.

For example, the preset formula may be:

$$Rcable = [(\text{Vadp\_detection\_yA} - \text{Vadp\_detection\_xA}) - (\text{Vbus\_detection\_yA} - \text{Vbus\_detection\_xA})]/(yA - xA)$$

where Rcable is the impedance value of the charging cable.

The preset formula is obtained based on a basic principle that voltages that are carried by the charging cable and that are obtained through two measurements and calculations under constant voltage and constant current electric energy with different current values (that is, the first electric energy and the second electric energy) have the same error, and referring to the charging scenario shown in FIG. 1, its specific deduction steps are as follows:

Step 1:

The electronic device 01 communicates and negotiates with the power supply device 03, to cause the power supply device to provide the electronic device 01 with electric energy at a constant voltage value and a current value Ibus. Ibus is a constant current, for example Ibus=x amperes (A).

Assuming that a detection error of Vadp in this case is ΔVadp_xA, and a real value of Vadp is Vadp_real_xA. If the electronic device 01 communicates with the power supply device 03 to obtain that a test value of Vadp detected by the power supply device 03 is Vadp_detection_xA, then:

$$\text{Vadp\_real\_xA} = \Delta\text{Vadp\_detection\_xA} + \Delta\text{Vadp\_xA}. \quad (1)$$

Assuming that a detection error of Vbus in this case is ΔVbus_xA, and a real value of Vbus is Vbus_real_xA. If the electronic device 01 communicates with the power supply device 03 to obtain that a test value of Vbus detected by the power supply device 03 is Vbus_detection_xA, then:

$$\text{Vbus\_real\_xA} = \text{Vbus\_detection\_xA} + \Delta\text{Vbus\_xA}. \quad (2)$$

In addition, because the reason of the voltage loss is that a part of the voltage is carried on the charging cable, $$\text{Vadp\_real\_xA} = \text{Vbus\_real\_xA} + xA * Rcable. \quad (3)$$

By substituting (1) and (2) into (3), it can be obtained that:

$$\text{Vadp\_detection\_xA} + \Delta\text{Vadp\_xA} = \text{Vbus\_detection\_xA} + \Delta\text{Vbus\_xA} + xA * Rcable. \quad (4)$$

In this case, a total error value ΔVref_xA of voltages (Vadp−Vbus) of two ends of the entire charging cable 02 is specifically as follows:

$$\Delta\text{Vref\_xA} = \Delta\text{Vadp\_xA} - \Delta\text{Vbus\_xA}. \quad (5)$$

It can be obtained from (4) that:

$$\Delta\text{Vadp\_xA} - \Delta\text{Vbus\_xA} = \text{Vbus\_detection\_xA} + xA * Rcable - \text{Vadp\_detection\_xA}. \quad (6)$$

By substituting (6) into (5), it can be obtained that:

$$\Delta\text{Vref\_xA} = \text{Vbus\_detection\_xA} + xA * Rcable - \text{Vadp\_detection\_xA}. \quad (7)$$

Step 2:

Based on a deduction process the same as that in step 1, the electronic device 01 negotiates and communicates with the power supply device 03, to make the power supply device provide the electronic device 01 with electric energy of which a voltage value is constant and a current value Ibus is yA. In addition, in a case that an absolute value of a difference between yA and xA is less than 2*yA and less than 2*xA, assuming that a test value of Vadp is Vadp_detection_yA, an error value of Vadp is ΔVadp_yA, a test value of Vbus is Vbus_detection_yA, an error value of Vbus is ΔVadp_yA, a total error value (Vadp−Vbus) is ΔVref_yA, it can be obtained that:

$$\Delta\text{Vref\_yA} = \Delta\text{Vadp\_yA} - \Delta\text{Vbus\_yA} = \text{Vbus\_detection\_yA} + yA * Rcable - \text{Vadp\_detection\_yA}. \quad (8)$$

Step 3:

Because the two cases are performed successively, and the impedance of the charging cable itself is very small (milliohm level), the same detection method is used for voltage detection, and current values corresponding to the two measurements are slight different, it can be learned that the error of voltage detection is slightly affected by the current, and all the measurements have the same error rate. Therefore, two measurements (that is, Vadp_detection_xA and Vadp_detection_yA) of voltages of an end of the charging cable connected to the power supply device have the same error, and two measurements (that is, Vbus_detection_xA and Vbus_detection_yA) of voltages of an end of the charging cable connected to the electronic device have the same error or errors that have only a slight difference.

For example, assuming that an error rate of each time of voltage detection is 1%, x is 1, y is 2, and Rcable is 100 mΩ, Vadp_real_xA=Vadp_real_yA is 10 volts (volt, V).

Assuming that Vbus_real_xA is 9.9 V, Vadp_detection_xA is 9.9 V, and Vbus_detection_xA is 9.801 V, ΔVref_xA is 0.001 V.

Assuming that Vbus_real_yA is 9.8 V, Vadp_detection_yA is 9.9 V, and Vbus_detection_yA is 9.702 V, ΔVref_yA is 0.0098 V.

It can be learned that ΔVref_xA and ΔVref_yA are approximately equal.

Based on the foregoing expressions, it can be considered that total error values (Vadp–Vbus) generated by two times of detection are the same, so it can be obtained that:

$$\text{Vbus\_detection\_xA} + xA * \text{RcableVadp\_detection\_xA} = \text{Vbus\_detection\_yA} + yA * Rcable - \text{Vadp\_detection\_yA}. \tag{9}$$

Based on (9), it can be obtained that:

$$(y - xA) * Rcable = \text{Vbus\_detection\_xA} - \text{Vadp\_detection\_xA} + \text{Vadp\_detection\_yA} - \text{Vbus\_detection\_yA} = (\text{Vadp\_detection\_yA} - \text{Vadp\_detection\_xA}) - (\text{Vbus\_detection\_yA} - \text{Vbus\_detection\_xA}). \tag{10}$$

Based on (10), it can be obtained that:

$$Rcable = [(\text{Vadp\_detection\_yA} - \text{Vadp\_detection\_xA}) - (\text{Vbus\_detection\_yA} - \text{Vbus\_detection\_xA})] / (yA - xA) \tag{11}$$

It can be learned from (11) that the impedance value of the charging cable 02 can be calculated according to only a difference between test values of Vadp under two different currents, a difference between test values of Vbus under two different currents, and a difference between the two different currents, and is not affected by detection errors of Vadp and Vbus anymore, which ensures the accuracy of the impedance value of the charging cable 02.

Based on the foregoing deduction process, the embodiments of this application provide a method for detecting impedance of a charging cable. The real impedance of the charging cable can be detected by the using the foregoing formula (11) as a preset formula, to provide effective data support for the electronic device to select a correct charging mode, thereby ensuring that the electronic device negotiates the most appropriate charging mode with the power supply device, and improving the charging safety and charging efficiency of the electronic device.

After step S809, the mobile phone 01A can negotiate an appropriate charging mode with the switch power adapter 03A according to the calculated impedance value of the charging cable. Specifically, in a case that the impedance value of the charging cable is greater than a preset threshold, the mobile phone 01A may negotiate with the switch power adapter 03A to charge the mobile phone 01A in an ordinary charging mode. In a case that the impedance value of the charging cable is less than the preset threshold, the mobile phone 01A may negotiate with the switch power adapter 03A to charge the mobile phone 01A in a quick charging mode.

The ordinary charging may be performing charging at a relatively low current or voltage. In this case, the charging is performed at a relatively low electric power, for example, an electric power lower than 20 W. The ordinary charging is a charging mode in which the electronic device can be charged from zero power to full power within a duration longer than a preset duration, so that the charging safety can be sufficiently ensured.

The quick charging is performing charging at a relatively high current or voltage. In this case, the charging is performed at a relatively high electric power, for example, an electric power higher than 20 W. 20 W herein is merely used as an example. In practice, such a power value may depend on an actual situation of the technical development, which is not specifically limited in this application. The quick charging is a charging mode in which the electronic device can be charged from zero power to full power within a preset duration, so that the charging efficiency is high.

For example, the preset threshold may be 300 mΩ. Certainly, in practice, the preset threshold may depend on actual requirements and technical development, and is merely an example herein. The preset threshold is not specifically limited.

It should be noted that the case that the impedance value of the charging cable is equal to the preset threshold may belong to the case that the impedance value of the charging cable is less than preset threshold or belong to the case that the impedance value of the charging cable is greater than the preset threshold, which is not specifically limited in this application.

In some embodiments, if the switch power adapter has a specific computing capability, in the foregoing solutions, the switch power adapter may request the mobile phone for the first final voltage detection value and the second final voltage detection value, and finally, the switch power adapter calculates the impedance value of the charging cable according to the preset formula based on the first source voltage detection value, the second source voltage detection value, the first final voltage detection value, the second final voltage detection value, the first current value, and the second current value. For a specific implementation procedure, refer to the foregoing embodiment. Details are not described herein again. Afterward, the switch power adapter can negotiate an appropriate charging mode with the mobile phone according to the impedance value of the charging cable calculated by itself. Certainly, the same is true if the power supply device is another power supply device with a processing capability. In this way, requirements of the technical solutions provided in the embodiments of this application for the processing and computing capabilities of the electronic device can be lowered.

In some other embodiments, if a chip with specific processing and computing capabilities is arranged in an interface of any end of the charging cable, in the technical solutions provided in the embodiments of this application, the interface in which the chip with specific processing and computing capabilities is arranged in the charging cable can request the mobile phone for the first final voltage detection value and the second final voltage detection value, request the switch power adapter for the first source voltage detection value and the second source voltage detection value, and detect a first current value and a second current value when the switch power adapter provides two different current values, and finally, the interface calculates the impedance value of the charging cable according to the preset formula based on the first source voltage detection value, the second source voltage detection value, the first final voltage detection value, the second final voltage detection value, the first current value, and the second current value. For a specific implementation procedure, refer to the foregoing embodiment. Details are not described herein again. Afterward, the interface sends the impedance value of the charging cable calculated by itself to the switch power adapter or mobile phone, to enable the two to negotiate an appropriate charging mode. In this way, requirements of the technical solutions provided in the embodiments of this application for the processing and computing capabilities of the electronic device can be lowered.

In some still other embodiments, if the charging cable itself does not function as a communication channel, and the power supply device and the electronic device can perform communication of related data in the foregoing embodiments through a wireless communication connection. In a feasible mode, the power supply device and the electronic device may have the Bluetooth function, the Bluetooth function of the power supply device can be always enabled in a case that the power supply device is connected to a power supply. When the electronic device detects that the power supply device start to supply power, the electronic device can prompt the user to establish a Bluetooth connected to the power supply device. Afterward, in a case that the user triggers a Bluetooth connection operation, the electronic device establishes a Bluetooth connection with the power supply device, and performs data communication according to the Bluetooth connection. In this way, the method for detecting impedance of a charging cable provided in the embodiments of this application can be successfully completed when the charging cable itself does not function as a communication channel.

Based on the technical solutions provided in this application embodiment, the mobile phone (that is, the electronic device) negotiates with the switch power adapter (that is, the power supply device) to make electric energy with the same initial voltage (that is, the voltage outputted by the power supply device to the charging cable) and different current values quickly pass through the charging cable in two times, to obtain voltage detection values of both ends of the charging cable under the two different current values. Then, the impedance value of the charging cable is calculated according to two different current values and voltage detection values of both ends of the charging cable under the two different current values by using the preset formula that derived in advance. Because the preset formula used in the entire detection and calculation process for the impedance value of the charging cable is deducted by taking the voltage detection error in to consideration, and parameters required for the calculation are directly detected, the impedance value of the charging cable can be calculated quickly and accurately. Effective data support is also provided for a mobile phone to negotiate with the switch power adapter to select a correct charging mode, thereby ensuring that the mobile phone and the switch power adapter can negotiate the appropriate charging mode, and improving the charging safety and charging efficiency of the mobile phone.

It may be understood that to implement the foregoing functions, the foregoing device (the electronic device and the power supply device) and the like include hardware structures and/or software modules for performing the various corresponding functions. A person skilled in the art should be easily aware that, in combination with the units and algorithm steps of the examples described in the embodiments disclosed in this specification, the embodiments of the present invention can be implemented by hardware or a combination of hardware and computer software. Whether a function is implemented by hardware or computer software driving hardware depends on particular applications and design constraints of the technical solutions. A person skilled in the art may use different methods to implement the described functions for each particular application, but it should not be considered that the implementation goes beyond the scope of the embodiments of this application.

In the embodiments of this application, functional modules of the electronic device may be divided based on the foregoing method example. For example, each functional module may be divided according to each function, or two or more functions may be integrated into one processing module. The integrated module may be implemented in the form of hardware, or may be implemented in the form of a software functional module. It should be noted that in this embodiment of the present invention, the division of the modules is merely an example, and is merely division of logical functions. During actual implementation, there may be another division manner.

Figure 9:
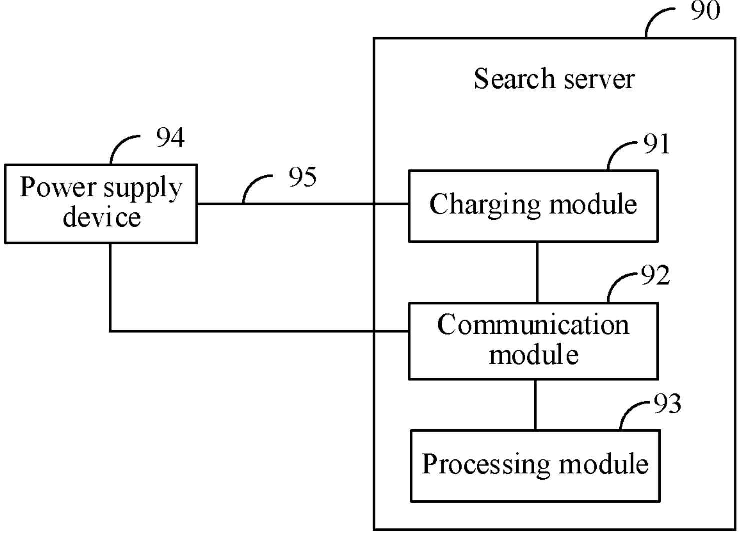
FIG. 9 is a schematic structural diagram of another electronic device according to an embodiment of this application.

In a case that the functional modules are divided corresponding to the functions, referring to FIG. 9, an embodiment of this application provides an electronic device 90, including: a charging module 91, a communication module 92, and a processing module 93.

The charging module 91 is configured to perform S803 and S807 in the foregoing embodiment. In addition, the charging module 91 is further configured to receive first electric energy and second electric energy provided by a power supply device 94 through a charging cable 95. The communication module 92 is configured to perform S801 and S805 in the foregoing embodiment. In addition, when the electronic device 90 communicates with the power supply device 91 in a wireless communication manner, the communication module 92 is further configured to perform wireless communication with the power supply device 94. The processing module 93 is configured to perform S809 in the foregoing embodiment. Certainly, during implementation, the charging module 91, the communication module 92, and the processing module 93 may be formed by a plurality of sub-modules that can implement different functions or perform different steps, which is not specifically limited in this application.

Specific operation execution manners of the modules in the electronic device in the foregoing embodiment have been described in detail in the embodiment about the method for detecting impedance of a charging cable in the embodiments described above, and details are not described herein again. Therefore, for the related beneficial effects, refer to the beneficial effects related to the method for detecting impedance of a charging cable described above. Details are not described herein again.

Figure 10:
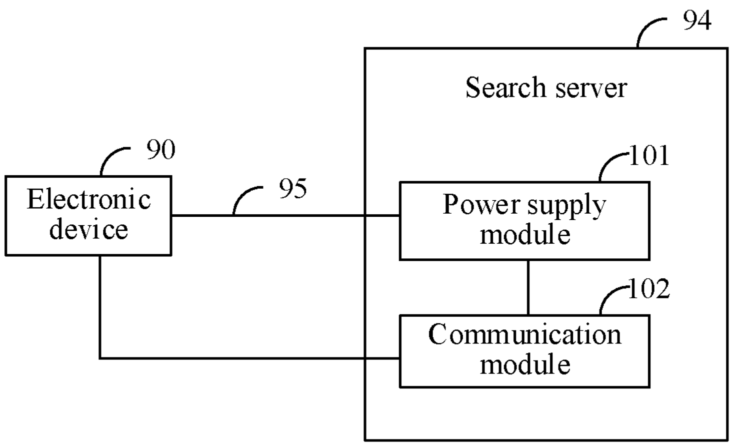
FIG. 10 is a schematic structural diagram of a power supply device according to an embodiment of this application.

In a case that the functional modules are divided corresponding to the functions, referring to FIG. 10, an embodiment of this application provides a power supply device 94, including: a power supply module 101 and a communication module 102.

The communication module 102 is further configured to perform the operation of receiving data from the electronic device 90 in the embodiment described above, for example, the operation of receiving the first request in S802, and the operation of receiving the second request in S806. In addition, when the electronic device 90 communicates with the power supply device 91 in a wireless communication manner, the communication module 102 is further configured to perform wireless communication with the electronic device 90.

The power supply module 101 is configured to perform S804 and S808 and operations other than the operations performed by the communication module 102 in and S802 and S806 in the foregoing embodiment. The power supply module 101 is further configured to supply, after receiving a charging mode (for example, ordinary charging or quick charging) indicated by the electronic device 90, power to the electronic device 90 by using charging parameters (for example, a voltage, a current, and an electric power) matching the charging mode.

Specific operation execution manners of the modules in the power supply device in the foregoing embodiment have been described in detail in the embodiment about the method for detecting impedance of a charging cable in the embodiments described above, and details are not described herein again. Therefore, for the related beneficial effects, refer to the beneficial effects related to the method for detecting impedance of a charging cable described above. Details are not described herein again.

The embodiments of this application further provide an electronic device. The electronic device is applied to a power supply device in a charging system. The charging system includes the power supply device, the charging cable, and an electronic device. A first end of the charging cable is connected to the power supply device, and a second end of the charging cable is connected to the electronic device. The electronic device includes: a processor, a memory, a battery, and a charging interface. The memory, the battery, and the charging interface are coupled to the processor. The memory stores computer program code, and the computer program code includes computer instructions; and in a case that the charging interface of the electronic device is connected to the charging cable, and it is detected that the power supply device supplies power to the electronic device through the charging cable, the computer instructions are executed by the processor, to cause the electronic device to perform the method for detecting impedance of a charging cable according to the foregoing embodiments. For a specific result of the electronic device, refer to the structure of the electronic device 01 shown in FIG. 6.

Specifically, in a case that the charging interface of the electronic device is connected to the charging cable, and it is detected that the power supply device supplies power to the electronic device through the charging cable, the computer instructions are executed by the processor, to cause the electronic device to perform the following steps: receiving, by the electronic device, first electric energy from the power supply device through the charging cable, and obtaining a first source voltage detection value of the first end of the charging cable and a first final voltage detection value of the second end of the charging cable, where a voltage of the first electric energy is constant, and a current of the first electric energy is a first current value; then, receiving, by the electronic device, second electric energy from the power supply device through the charging cable, and obtaining a second source voltage detection value of the first end of the charging cable and a second final voltage detection value of the second end of the charging cable, where a voltage of the second electric energy is the same as the voltage of the first electric energy, and a current of the second electric energy is a second current value; and finally, calculating, by the electronic device, an impedance value of the charging cable according to the first source voltage detection value, the second source voltage detection value, the first final voltage detection value, the second final voltage detection value, the first current value, and the second current value.

Optionally, when the computer instructions are executed by the processor, the electronic device is caused to further perform the following step: instructing, by the electronic device when the impedance value of the charging cable is less than a preset threshold, the power supply device to perform quick charging for the electronic device. The quick charging refers to a charging mode in which the electronic device is charged from zero power to full power within a preset duration.

Optionally, when the computer instructions are executed by the processor, the electronic device is caused to further perform the following steps: before the receiving, by the electronic device, first electric energy from the power supply device through the charging cable, sending a first request to the power supply device through the charging cable in a case that the electronic device detects that the power supply device supplies power to the electronic device through the charging cable, where the first request is used for requesting the power supply device to provide the first electric energy to the electronic device through the charging cable and requesting the power supply device to indicate the first source voltage detection value of the first end of the charging cable to the electronic device; then, receiving, by the electronic device, the first source voltage detection value indicated by the power supply device; and detecting, by the electronic device, the first final voltage detection value of the second end of the charging cable.

Optionally, when the computer instructions are executed by the processor, the electronic device is caused to further perform the following steps: before the receiving, by the electronic device, second electric energy from the power supply device through the charging cable, sending, by the electronic device, a second request to the power supply device through the charging cable after obtaining the first source voltage detection value and the first final voltage detection value, where the second request is used for requesting the power supply device to provide the second electric energy to the electronic device through the charging cable and requesting the power supply device to indicate the second source voltage detection value of the first end of the charging cable to the electronic device; then, receiving, by the electronic device, the second source voltage detection value indicated by the power supply device; and detecting, by the electronic device, the second final voltage detection value of the second end of the charging cable.

Optionally, an absolute value of a difference between the first current value and the second current value is less than two times the first current value, and the absolute value of the difference between the first current value and the second current value is less than two times the second current value.

Optionally, when the computer instructions are executed by the processor, the electronic device is caused to further perform the following step: calculating, by the electronic device, an impedance value of the charging cable according to the first source voltage detection value, the second source voltage detection value, the first final voltage detection value, the second final voltage detection value, the first current value, and the second current value by using the following formula:

$$Rcable = [(\mathrm{Vadp\_detection\_yA} - \mathrm{Vadp\_detection\_xA}) - (\mathrm{Vbus\_detection\_yA} - \mathrm{Vbus\_detection\_xA})] / (yA - xA)$$

where Rcable is the impedance value of the charging cable, Vadp_detection_yA is the second source voltage detection value, Vadp_detection_xA is the first source voltage detection value, Vbus_detection_yA is the second final voltage detection value, Vbus_detection_xA is the first final voltage detection value, yA is the second current value, and xA is the first current value.

The embodiments of this application further provide a power supply device. The power supply device is applied to a power supply device in a charging system. The charging system includes the power supply device, the charging cable, and an electronic device. A first end of the charging cable is connected to the power supply device, and a second end of the charging cable is connected to the electronic device. The power supply device including a memory, a processor, a bus, and a power supply interface. The memory is configured to store computer-executable instructions, and the processor is connected to the memory by the bus. In a case that the power supply interface of the power supply device is connected to the charging cable and supplies power to the electronic device, the processor executes the computer-executable instructions stored in the memory, to cause the power supply device to perform the method for detecting impedance of a charging cable according to the foregoing embodiments.

Specifically, in a case that the power supply interface of the power supply device is connected to the charging cable and supplies power to the electronic device, the processor executes the computer-executable instructions stored in the memory, to cause the power supply device to perform the following step: first receiving, by the power supply device, a first request from the electronic device through the charging cable, where the first request is used for requesting the power supply device to provide the first electric energy to the electronic device through the charging cable and requesting the power supply device to indicate the first source voltage detection value of the first end of the charging cable to the electronic device, and a voltage of the first electric energy is constant, and a current of the first electric energy is a first current value; then, providing, by the power supply device, the first electric energy to the electronic device through the charging cable in response to the first request, and indicating, after detecting the first source voltage detection value of the first end of the charging cable, the first source voltage detection value to the electronic device; afterward, receiving, by the power supply device, a second request from the electronic device through the charging cable, where the second request is used for requesting the power supply device to provide the second electric energy to the electronic device through the charging cable and requesting the power supply device to indicate the second source voltage detection value of the first end of the charging cable to the electronic device, and a voltage of the second electric energy is the same as the voltage of the first electric energy, and a current of the second electric energy is a second current value; and finally, providing, by the power supply device, the second electric energy to the electronic device through the charging cable in response to the second request, and indicating, after detecting the second source voltage detection value of the first end of the charging cable, the second source voltage detection value to the electronic device.

Optionally, an absolute value of a difference between the first current value and the second current value is less than two times the first current value, and the absolute value of the difference between the first current value and the second current value is less than two times the second current value.

The embodiments of this application further provide a computer-readable storage medium, including computer instructions, where the computer instructions, when run on the electronic device, cause the electronic device to perform the method for detecting impedance of a charging cable according to the foregoing embodiments or cause the electronic device to perform various functions or steps implemented by the mobile phone 01A in the foregoing embodiments.

The embodiments of this application further provide a computer-readable storage medium, including computer instructions, where the computer instructions, when run on the power supply device, cause the power supply device to perform the method for detecting impedance of a charging cable according to the foregoing embodiments or cause the power supply device to perform various functions or steps implemented by the switch power adapter 03A in the foregoing embodiments.

The embodiments of this application further provide a computer program product, where the computer program product, when run on a computer, causes the computer to perform the method for detecting impedance of a charging cable according to the foregoing embodiments or causes the computer to perform various functions or steps implemented by the mobile phone 01A in the foregoing embodiments. The computer may be the foregoing electronic device.

The embodiments of this application further provide a computer program product, where the computer program product, when run on a computer, causes the computer to perform the method for detecting impedance of a charging cable according to the foregoing embodiments or causes the computer to perform various functions or steps implemented by the switch power adapter 03A in the foregoing embodiments. The computer may be the foregoing power supply device.

The embodiments of this application provide a charging system. The system includes a charging cable, the electronic device according to the foregoing embodiments, and the power supply device according to the foregoing embodiments. For a specific architecture, refer to FIG. 1.

Through the descriptions of the foregoing implementations, a person skilled in the art may clearly understand that, for the purpose of convenient and brief description, only division of the foregoing functional modules is used as an example for description. In actual application, the foregoing functions may be allocated to and completed by different functional modules according to requirements. That is, an inner structure of an apparatus is divided into different functional modules to complete all or some of the functions described above.

In the several embodiments provided in this application, it should be understood that the disclosed apparatus and method may be implemented in other manners. For example, the described apparatus embodiment is merely an example. For example, the module or unit division is merely logical function division and may be other division in actual implementation. For example, a plurality of units or components may be combined or integrated into another apparatus, or some features may be ignored or not performed. In addition, the displayed or discussed mutual couplings or direct couplings or communication connections may be implemented by using some interfaces. The indirect couplings or communication connections between the apparatuses or units may be implemented in electric, mechanical, or other forms.

The units described as separate components may or may not be physically separate, and components displayed as units may be one or more physical units, may be located in one place, or may be distributed on a plurality of different places. Some or all of the units may be selected according to actual needs to achieve the objectives of the solutions of the embodiments hereof.

In addition, functional units in the embodiments of this application may be integrated into one processing unit, or each of the units may exist alone physically, or two or more units are integrated into one unit. The integrated unit may be implemented in the form of hardware, or may be implemented in the form of a software function unit.

When the integrated unit is implemented in the form of a software functional unit and sold or used as an independent product, the integrated unit may be stored in a readable storage medium. Based on such an understanding, the technical solutions in the embodiments of this application essentially, or the part contributing to the prior art, or all or some of the technical solutions may be implemented in the form of a software product. The software product is stored in a storage medium and includes several instructions for instructing a device (which may be a single-chip microcomputer, a chip, or the like) or a processor (processor) to perform all or some of the steps of the methods described in the embodiments of this application. The foregoing storage medium includes: any medium that can store program code, such as a USB flash drive, a removable hard disk, a read-only memory (read only memory, ROM), a random-access memory (random access memory, RAM), a magnetic disk, or an optical disc.

The foregoing content is only specific implementations of this application, but is not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A method for detecting impedance of a charging cable, applied to an electronic device in a charging system, wherein the charging system comprises a power supply device, the charging cable, and the electronic device, a first end of the charging cable is connected to the power supply device, and a second end of the charging cable is connected to the electronic device, the method comprising:

receiving, by the electronic device, first electric energy from the power supply device through the charging cable, and obtaining a first source voltage detection value measured at the first end of the charging cable connected to the power supply device and a first final voltage detection value measured at the second end of the charging cable connected to the electronic device, wherein a first voltage of the first electric energy output by the power supply device is constant, the first source voltage detection value is different from the first voltage, and a first current of the first electric energy is a first current value;

receiving, by the electronic device, second electric energy from the power supply device through the charging cable, and obtaining a second source voltage detection value measured at the first end of the charging cable connected to the power supply device and a second final voltage detection value measured at the second end of the charging cable connected to the electronic device, wherein the power supply device outputs the second electric energy at the first voltage, the second source voltage detection value is different from the first voltage, and a second current of the second electric energy is a second current value different from the first current value; and calculating, by the electronic device, an impedance value of the charging cable according to the first source voltage detection value, the second source voltage detection value, the first final voltage detection value, the second final voltage detection value, the first current value, and the second current value.

2. The method according to claim 1, wherein the method further comprises:

instructing, by the electronic device when the impedance value of the charging cable is less than a preset threshold, the power supply device to perform quick charging for the electronic device, wherein the quick charging refers to a charging mode in which the electronic device is charged from zero power to full power within a preset duration.

3. The method according to claim 1, wherein before the receiving, by the electronic device, the first electric energy from the power supply device through the charging cable, the method further comprises:

sending a first request to the power supply device through the charging cable based on that the electronic device detects that the power supply device supplies power to the electronic device through the charging cable, wherein the first request is used for requesting the power supply device to provide the first electric energy to the electronic device through the charging cable and requesting the power supply device to indicate the first source voltage detection value of the first end of the charging cable to the electronic device; and the obtaining the first source voltage detection value of the first end of the charging cable and the first final voltage detection value of the second end of the charging cable comprises:

receiving, by the electronic device, the first source voltage detection value indicated by the power supply device; and detecting, by the electronic device, the first final voltage detection value of the second end of the charging cable.

4. The method according to claim 1, wherein before the receiving, by the electronic device, the second electric energy from the power supply device through the charging cable, the method further comprises:

sending, by the electronic device, a second request to the power supply device through the charging cable after obtaining the first source voltage detection value and the first final voltage detection value, wherein the second request is used for requesting the power supply device to provide the second electric energy to the electronic device through the charging cable and requesting the power supply device to indicate the second source voltage detection value of the first end of the charging cable to the electronic device; and the obtaining the second source voltage detection value of the first end of the charging cable and the second final voltage detection value of the second end of the charging cable comprises:

receiving, by the electronic device, the second source voltage detection value indicated by the power supply device; and detecting, by the electronic device, the second final voltage detection value of the second end of the charging cable.

5. The method according to claim 1, wherein an absolute value of a difference between the first current value and the second current value is less than two times the first current value, and the absolute value of the difference between the first current value and the second current value is less than two times the second current value.

6. The method according to claim 1, wherein the calculating, by the electronic device, the impedance value of the charging cable according to the first source voltage detection value, the second source voltage detection value, the first final voltage detection value, the second final voltage detection value, the first current value, and the second current value comprises:

calculating, by the electronic device, the impedance value of the charging cable according to the first source voltage detection value, the second source voltage detection value, the first final voltage detection value, the second final voltage detection value, the first current value, and the second current value by using the following formula:

$$Rcable = [(\text{Vadp\_detection\_yA} - \text{Vadp\_detection\_xA}) - (\text{Vbus\_detection\_yA} - \text{Vbus\_detection\_xA})]/(yA - xA)$$

wherein Rcable is the impedance value of the charging cable, Vadp_detection_yA is the second source voltage detection value, Vadp_detection_xA is the first source voltage detection value, Vbus_detection_yA is the second final voltage detection value, Vbus_detection_xA is the first final voltage detection value, yA is the second current value, and xA is the first current value.

7. An electronic device, applied to a charging system, wherein the charging system comprises a power supply device, a charging cable, and the electronic device, a first end of the charging cable is connected to the power supply device, and a second end of the charging cable is connected to the electronic device, the electronic device comprising: a processor, a memory, a battery, and a charging interface, wherein the memory, the battery, and the charging interface are coupled to the processor, the memory stores computer program code, and the computer program code comprises computer instructions; and based on that the charging interface of the electronic device is connected to the charging cable, and it is detected that the power supply device supplies power to the electronic device through the charging cable, the computer instructions are executed by the processor, to cause the electronic device to perform operations including:

receiving first electric energy from the power supply device through the charging cable, and obtaining a first source voltage detection value measured at the first end of the charging cable connected to the power supply device and a first final voltage detection value measured at the second end of the charging cable connected to the electronic device, wherein a first voltage of the first electric energy output by the power supply device is constant, the first source voltage detection value is different from the first voltage, and a first current of the first electric energy is a first current value;

receiving second electric energy from the power supply device through the charging cable, and obtaining a second source voltage detection value measured at the first end of the charging cable connected to the power supply device and a second final voltage detection value measured at the second end of the charging cable connected to the electronic device, wherein the power supply device outputs the second electric energy at the first voltage, the second source voltage detection value is different from the first voltage, and a second current of the second electric energy is a second current value different from the first current value; and calculating an impedance value of the charging cable according to the first source voltage detection value, the second source voltage detection value, the first final voltage detection value, the second final voltage detection value, the first current value, and the second current value.

8. The electronic device according to claim 7, the operations further comprising:

instructing, when the impedance value of the charging cable is less than a preset threshold, the power supply device to perform quick charging for the electronic device, wherein the quick charging refers to a charging mode in which the electronic device is charged from zero power to full power within a preset duration.

9. The electronic device according to claim 7, wherein before the receiving the first electric energy from the power supply device through the charging cable, the operations further comprising:

sending a first request to the power supply device through the charging cable based on that the electronic device detects that the power supply device supplies power to the electronic device through the charging cable, wherein the first request is used for requesting the power supply device to provide the first electric energy to the electronic device through the charging cable and requesting the power supply device to indicate the first source voltage detection value of the first end of the charging cable to the electronic device; and the obtaining the first source voltage detection value of the first end of the charging cable and the first final voltage detection value of the second end of the charging cable comprises:

receiving the first source voltage detection value indicated by the power supply device; and detecting the first final voltage detection value of the second end of the charging cable.

10. The electronic device according to claim 7, wherein before the receiving the second electric energy from the power supply device through the charging cable, the operations further comprising:

sending a second request to the power supply device through the charging cable after obtaining the first source voltage detection value and the first final voltage detection value, wherein the second request is used for requesting the power supply device to provide the second electric energy to the electronic device through the charging cable and requesting the power supply device to indicate the second source voltage detection value of the first end of the charging cable to the electronic device; and the obtaining the second source voltage detection value of the first end of the charging cable and the second final voltage detection value of the second end of the charging cable comprises:

receiving the second source voltage detection value indicated by the power supply device; and detecting the second final voltage detection value of the second end of the charging cable.

11. The electronic device according to claim 7, wherein an absolute value of a difference between the first current value and the second current value is less than two times the first current value, and the absolute value of the difference between the first current value and the second current value is less than two times the second current value.

12. The electronic device according to claim 7, wherein the calculating the impedance value of the charging cable according to the first source voltage detection value, the second source voltage detection value, the first final voltage detection value, the second final voltage detection value, the first current value, and the second current value comprises:

calculating the impedance value of the charging cable according to the first source voltage detection value, the second source voltage detection value, the first final voltage detection value, the second final voltage detection value, the first current value, and the second current value by using the following formula:

$$Rcable = [(\text{Vadp\_detection\_yA} - \text{Vadp\_detection\_xA}) - (\text{Vbus\_detection\_yA} - \text{Vbus\_detection\_xA})]/(yA - xA)$$

wherein Rcable is the impedance value of the charging cable, Vadp_detection_yA is the second source voltage detection value, Vadp_detection_xA is the first source voltage detection value, Vbus_detection_yA is the second final voltage detection value, Vbus_detection_xA is the first final voltage detection value, yA is the second current value, and xA is the first current value.

13. A non-transitory computer-readable storage medium, comprising computer instructions, wherein the computer instructions, when run on an electronic device, cause the electronic device to perform operations including:

receiving first electric energy from a power supply device through a charging cable, and obtaining a first source voltage detection value measured at a first end of the charging cable connected to the power supply device and a first final voltage detection value measured at a second end of the charging cable connected to the electronic device, wherein a first voltage of the first electric energy output by the power supply device is constant, the first source voltage detection value is different from the first voltage, and a first current of the first electric energy is a first current value;

receiving second electric energy from the power supply device through the charging cable, and obtaining a second source voltage detection value measured at the first end of the charging cable connected to the power supply device and a second final voltage detection value measured at the second end of the charging cable connected to the electronic device, wherein the power supply device outputs the second electric energy at the first voltage, the second source voltage detection value is different from the first voltage, and a second current of the second electric energy is a second current value different from the first current value; and calculating an impedance value of the charging cable according to the first source voltage detection value, the second source voltage detection value, the first final voltage detection value, the second final voltage detection value, the first current value, and the second current value.

14. The non-transitory computer-readable storage medium according to claim 13, the operations further comprising:

instructing, when the impedance value of the charging cable is less than a preset threshold, the power supply device to perform quick charging for the electronic device, wherein the quick charging refers to a charging mode in which the electronic device is charged from zero power to full power within a preset duration.

15. The non-transitory computer-readable storage medium according to claim 13, wherein before the receiving the first electric energy from the power supply device through the charging cable, the operations further comprising:

sending a first request to the power supply device through the charging cable based on that the electronic device detects that the power supply device supplies power to the electronic device through the charging cable, wherein the first request is used for requesting the power supply device to provide the first electric energy to the electronic device through the charging cable and requesting the power supply device to indicate the first source voltage detection value of the first end of the charging cable to the electronic device; and the obtaining the first source voltage detection value of the first end of the charging cable and the first final voltage detection value of the second end of the charging cable comprises:

receiving the first source voltage detection value indicated by the power supply device; and detecting the first final voltage detection value of the second end of the charging cable.

16. The non-transitory computer-readable storage medium according to claim 13, wherein before the receiving the second electric energy from the power supply device through the charging cable, the operations further comprising:

sending a second request to the power supply device through the charging cable after obtaining the first source voltage detection value and the first final voltage detection value, wherein the second request is used for requesting the power supply device to provide the second electric energy to the electronic device through the charging cable and requesting the power supply device to indicate the second source voltage detection value of the first end of the charging cable to the electronic device; and the obtaining the second source voltage detection value of the first end of the charging cable and the second final voltage detection value of the second end of the charging cable comprises:

receiving the second source voltage detection value indicated by the power supply device; and detecting the second final voltage detection value of the second end of the charging cable.

17. The non-transitory computer-readable storage medium according to claim 13, wherein an absolute value of a difference between the first current value and the second current value is less than two times the first current value, and the absolute value of the difference between the first current value and the second current value is less than two times the second current value.

18. The non-transitory computer-readable storage medium according to claim 13, wherein the calculating the impedance value of the charging cable according to the first source voltage detection value, the second source voltage detection value, the first final voltage detection value, the second final voltage detection value, the first current value, and the second current value comprises:

calculating the impedance value of the charging cable according to the first source voltage detection value, the second source voltage detection value, the first final voltage detection value, the second final voltage detection value, the first current value, and the second current value by using the following formula:

$$Rcable = [(\text{Vadp\_detection\_yA} - \text{Vadp\_detection\_xA}) - (\text{Vbus\_detection\_yA} - \text{Vbus\_detection\_xA})] / (yA - xA)$$

wherein Rcable is the impedance value of the charging cable, Vadp_detection_yA is the second source voltage detection value, Vadp_detection_xA is the first source voltage detection value, Vbus_detection_yA is the second final voltage detection value, Vbus_detection_xA is the first final voltage detection value, yA is the second current value, and xA is the first current value.

* * * * *